United States Patent
Ahn et al.

(10) Patent No.: US 12,048,143 B2
(45) Date of Patent: Jul. 23, 2024

(54) SEMICONDUCTOR MEMORY DEVICE

(71) Applicant: Samsung Electronics Co., Ltd., Suwon-si (KR)

(72) Inventors: Jiyoung Ahn, Suwon-si (KR); Yongseok Ahn, Seoul (KR); Hyunyong Kim, Daegu (KR); Minsub Um, Suwon-si (KR); Ju Hyung We, Hwaseong-si (KR); Joonkyu Rhee, Hwaseong-si (KR); Yoonyoung Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 17/392,775

(22) Filed: Aug. 3, 2021

(65) Prior Publication Data
US 2022/0157822 A1 May 19, 2022

(30) Foreign Application Priority Data
Nov. 16, 2020 (KR) .................. 10-2020-0152715

(51) Int. Cl.
*H10B 12/00* (2023.01)
(52) U.S. Cl.
CPC ....... *H10B 12/315* (2023.02); *H10B 12/0335* (2023.02); *H10B 12/053* (2023.02); *H10B 12/34* (2023.02); *H10B 12/482* (2023.02); *H10B 12/485* (2023.02)
(58) Field of Classification Search
None
See application file for complete search history.

(56) References Cited

U.S. PATENT DOCUMENTS

| | | |
|---|---|---|
| 7,514,324 B2 | 4/2009 | Leslie |
| 7,608,504 B2 | 10/2009 | Liu et al. |
| 9,214,382 B2 | 12/2015 | Lee et al. |
| 10,204,910 B2 | 2/2019 | Kim et al. |
| 10,522,548 B2 | 12/2019 | Chun |
| 10,622,249 B2 | 4/2020 | Yoon |
| 2014/0353744 A1 | 12/2014 | Jung et al. |

(Continued)

FOREIGN PATENT DOCUMENTS

| | | |
|---|---|---|
| CN | 102044546 B | 4/2013 |
| CN | 108206208 A | 6/2018 |
| KR | 1020140081549 A | 7/2014 |

*Primary Examiner* — Steven M Christopher
(74) *Attorney, Agent, or Firm* — Muir Patent Law, PLLC

(57) ABSTRACT

A semiconductor memory device includes a substrate including a device isolation pattern defining an active pattern extending in a first direction and including first and second source/drain regions, a word line extending in a second direction intersecting the first direction, a bit line that is on the word line and electrically connected to the first source/drain region and that extends in a third direction that intersects the first and second directions, a bit-line spacer on a sidewall of the bit line, a storage node contact electrically connected to the second source/drain region and spaced apart from the bit line across the bit-line spacer, and a dielectric pattern between the bit-line spacer and the storage node contact. The bit-line spacer includes a first spacer covering the sidewall of the bit line and a second spacer between the dielectric pattern and the first spacer.

20 Claims, 21 Drawing Sheets

(56) References Cited

U.S. PATENT DOCUMENTS

| | | | |
|---|---|---|---|
| 2016/0027727 A1* | 1/2016 | Kim | H10B 12/34 |
| | | | 257/774 |
| 2018/0190656 A1* | 7/2018 | Ho | H01L 21/76834 |
| 2018/0226290 A1 | 8/2018 | Lee et al. | |
| 2018/0286870 A1* | 10/2018 | Kim | H10B 12/48 |
| 2019/0296026 A1 | 9/2019 | Ji et al. | |
| 2020/0135850 A1 | 4/2020 | Yoon et al. | |
| 2020/0203354 A1 | 6/2020 | Lee et al. | |

\* cited by examiner

SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2020-0152715 filed on Nov. 16, 2020 in the Korean Intellectual Property Office, the disclosure of which is hereby incorporated by reference in its entirety.

BACKGROUND

The present inventive concepts relate to a semiconductor memory device.

Semiconductor devices have an important role in the electronic industry because of their small size, multi-functionality, and/or low fabrication costs. Semiconductor devices have been increasingly integrated with the development of the electronic industry. Line widths of patterns of semiconductor devices are being reduced for high integration thereof. However, new exposure techniques and/or expensive exposure techniques are being used for fine patterns of highly-integrated semiconductor devices. Various studies have thus recently been conducted for new integration techniques.

SUMMARY

Some example embodiments of the present inventive concepts provide a semiconductor memory device with improved electrical characteristics.

Some example embodiments of the present inventive concepts provide a semiconductor memory device with increased reliability.

The object of the present inventive concepts is not limited to the mentioned above, and other objects which have not been mentioned above will be clearly understood to those skilled in the art from the following description.

According to some example embodiments of the present inventive concepts, a semiconductor memory device may include a substrate that includes a device isolation pattern defining an active pattern extending in a first direction, the active pattern including a first source/drain region and a second source/drain region, a word line that extends in a second direction intersecting the first direction, a bit line on the word line and electrically connected to the first source/drain region, the bit line extending in a third direction that intersects both the first direction and the second direction, a bit-line spacer on a sidewall of the bit line, a storage node contact electrically connected to the second source/drain region and spaced apart from the bit line, the bit-line spacer being disposed between the bit line and the storage node contact, and a dielectric pattern between the bit-line spacer and the storage node contact. The bit-line spacer may include a first spacer that covers the sidewall of the bit line, and a second spacer between the dielectric pattern and the first spacer.

According to some example embodiments of the present inventive concepts, a semiconductor memory device may include a substrate that includes a device isolation pattern defining an active pattern extending in a first direction, the active pattern including a first source/drain region and a second source/drain region, a word line that extends in a second direction intersecting the first direction, a bit line on the word line and electrically connected to the first source/drain region, the bit line extending in a third direction that intersects both the first direction and the second direction, a bit-line spacer on a sidewall of the bit line, a storage node contact electrically connected to the second source/drain region and spaced apart from the bit line, the bit-line spacer being disposed between the bit line and the storage node contact, a dielectric fence vertically overlapping the word line and between the storage node contact and another storage node contact, and a dielectric pattern between the storage node contact and the bit-line spacer and between the storage node contact and the dielectric fence. When the semiconductor memory device is viewed in a plan view, the dielectric pattern may have a tetragonal ring-shaped structure or a circular ring-shaped structure.

According to some example embodiments of the present inventive concepts, a semiconductor memory device may include a substrate that includes an active pattern having a major axis in a first direction, the active pattern including a first source/drain region and a pair of second source/drain regions that are spaced apart in the first direction from each other, the first source/drain region being disposed between the pair of second source/drain regions, and the substrate including a device isolation pattern that defines the active pattern, a word line that extends in a second direction intersecting the first direction, a bit line on the word line and electrically connected to the first source/drain region, the bit line extending in a third direction that intersects both the first direction and the second direction, a first bit-line spacer on a sidewall of the bit line, a first storage node contact electrically connected to one of the pair of second source/drain regions and spaced apart from the bit line, the first bit-line spacer being disposed between the first storage node contact and the bit line, a bit-line contact electrically connected to the first source/drain region, a bit-line capping pattern on the bit line, a landing pad electrically connected to the first storage node contact, a bottom electrode on the landing pad, and a dielectric pattern between the first bit-line spacer and the first storage node contact. The first bit-line spacer may include a first spacer that covers the sidewall of the bit line, and a second spacer between the dielectric pattern and the first spacer.

BRIEF DESCRIPTION OF THE DRAWINGS

FIGS. 1A-1 illustrates a plan view showing a semiconductor memory device according to some example embodiments of the present inventive concepts.

FIGS. 2A to 10A illustrate plan views showing a method of fabricating a semiconductor memory device according to some example embodiments of the present inventive concepts.

FIGS. 2B to 10B illustrate cross-sectional views taken along line I-I' and II-II' of FIGS. 2A to 10A, respectively.

DETAILED DESCRIPTION OF EMBODIMENTS

Some example embodiments of the present inventive concepts will now be described in detail with reference to the accompanying drawings to aid in clearly explaining the present inventive concepts.

Figure 1A:
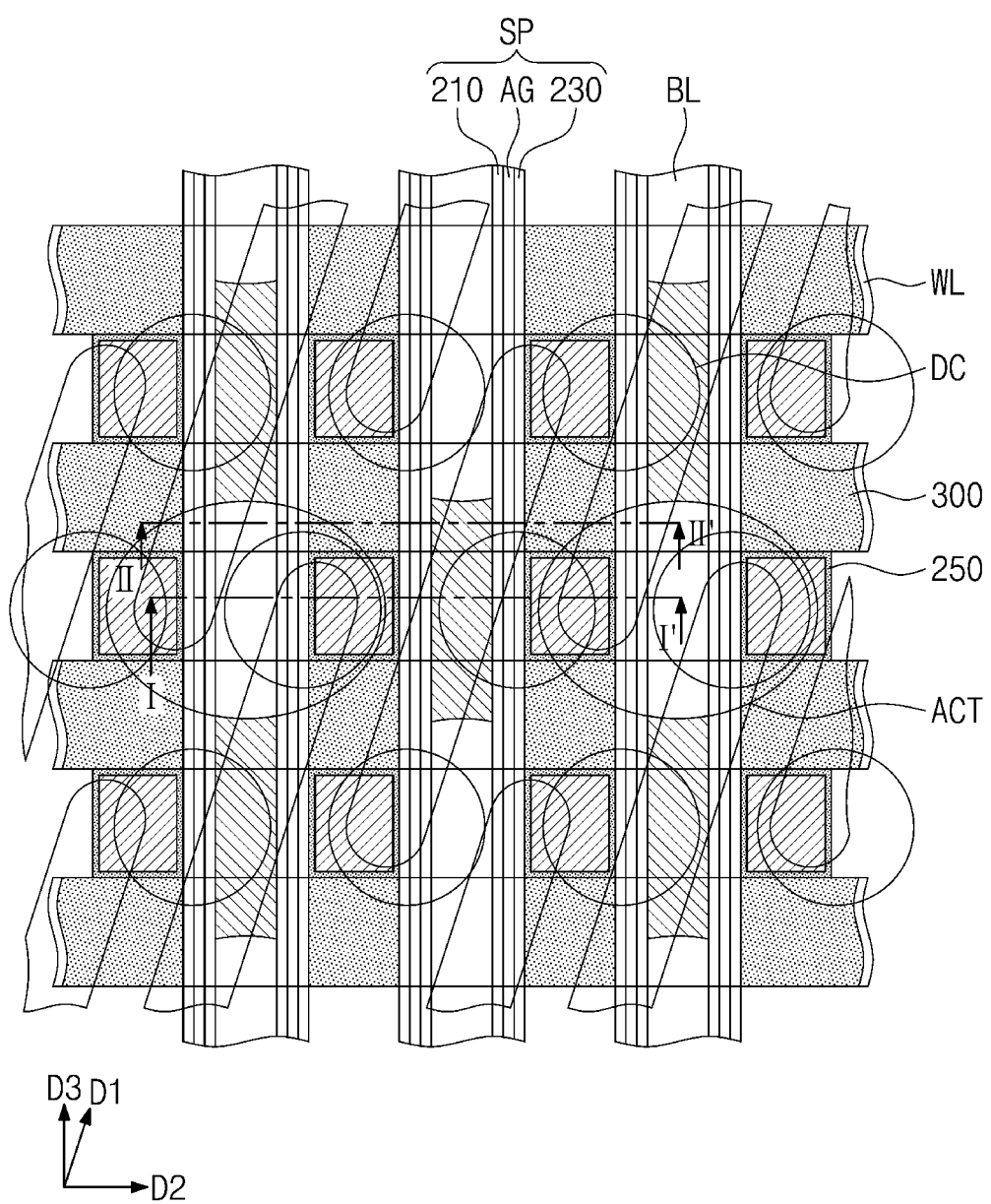
FIG. 1A illustrates a plan view showing a semiconductor memory device according to some example embodiments of the present inventive concepts.
Figures 1, 1A:
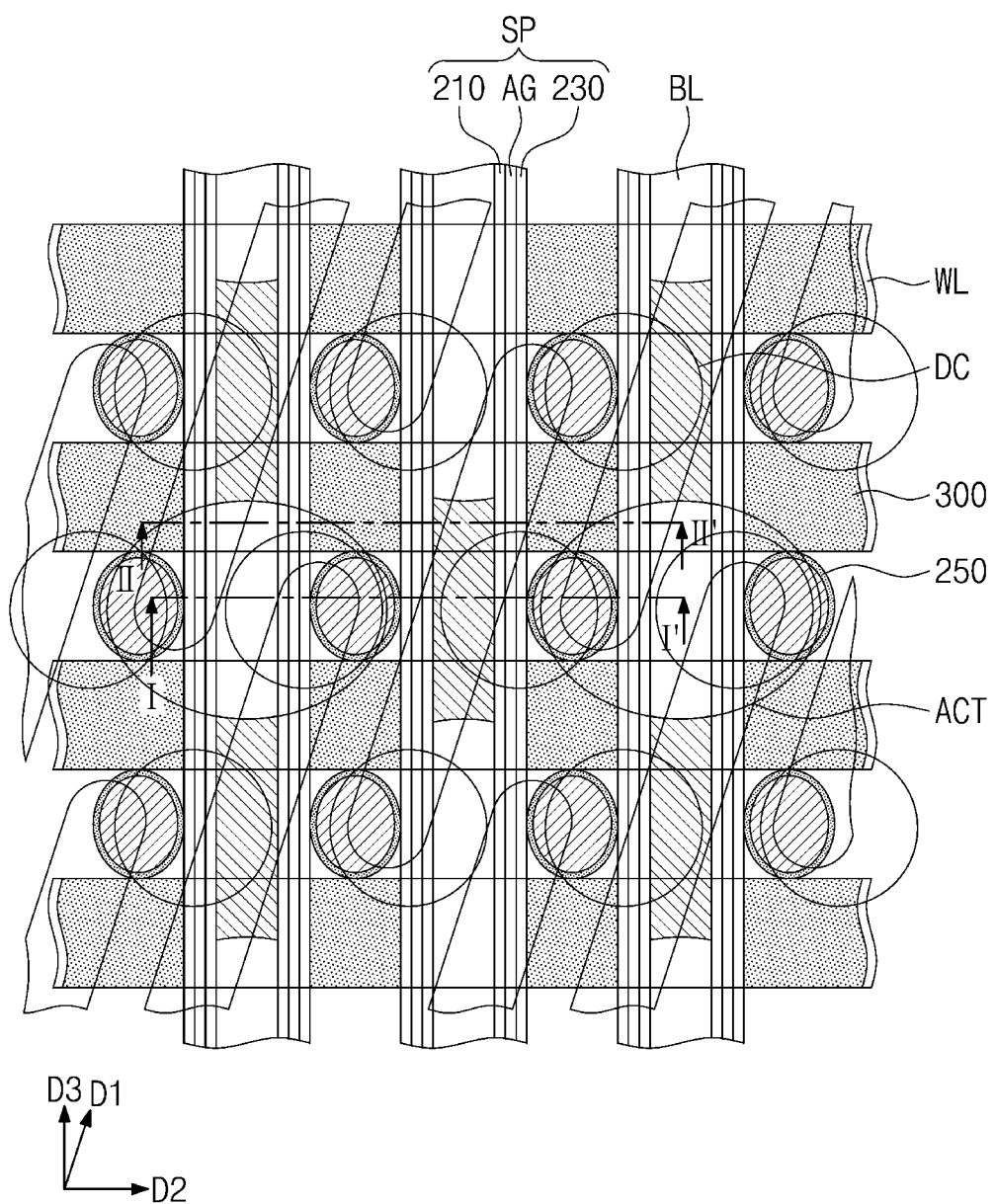
Figure 1B:
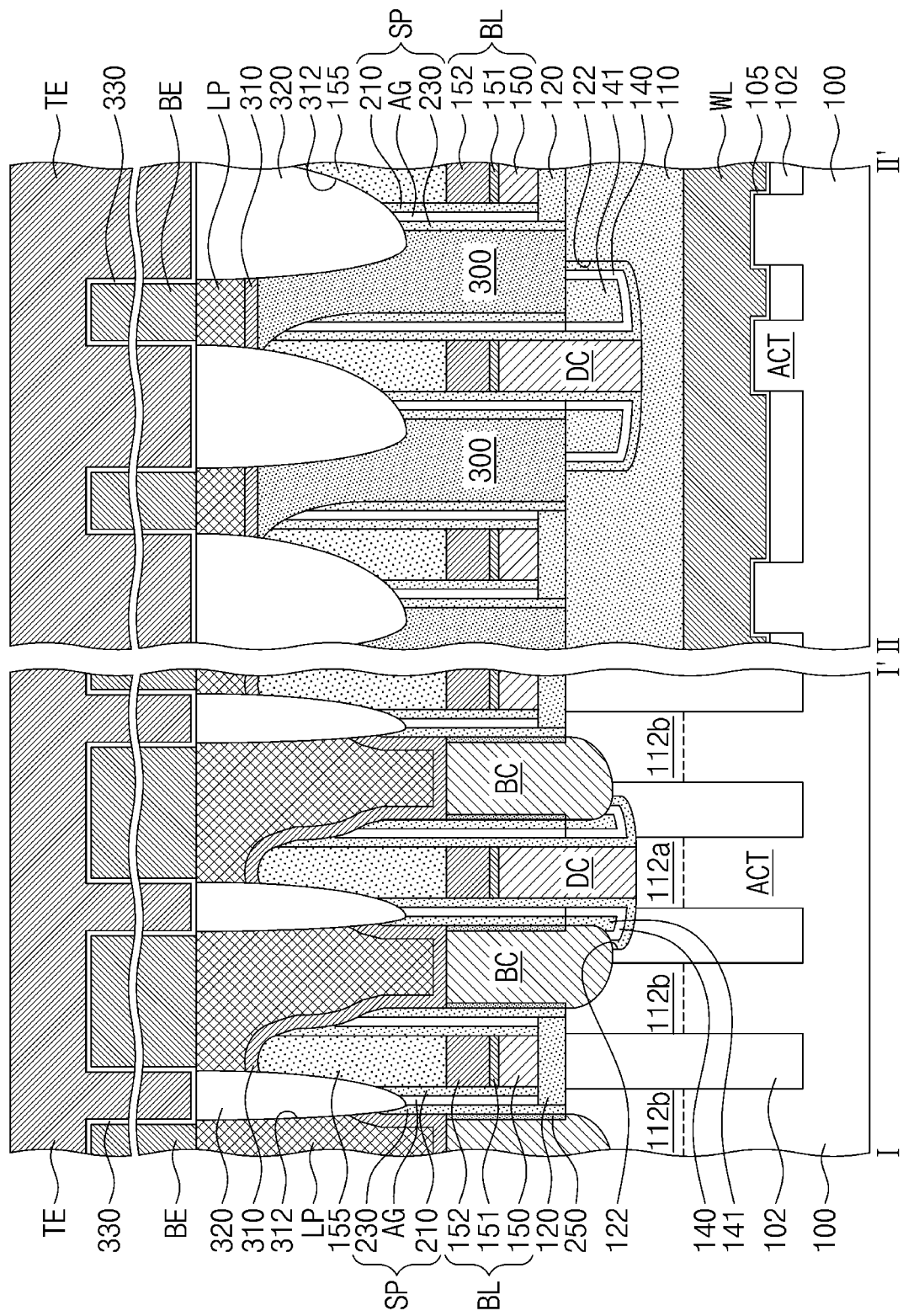
FIG. 1B illustrates a cross-sectional view taken along lines I-I' and II-II' of FIG. 1A.

FIG. 1A illustrates a plan view showing a semiconductor memory device according to some example embodiments of the present inventive concepts. FIG. 1B illustrates a cross-sectional view taken along lines I-I' and II-II' of FIG. 1A.

Referring to FIGS. 1A and 1B, a substrate 100 may be provided therein with a device isolation pattern 102 that defines active patterns ACT. The substrate 100 may be a semiconductor substrate, such as a silicon substrate, a germanium substrate, or a silicon-germanium substrate. The device isolation pattern 102 may include or may be formed of, for example, one or more of silicon oxide, silicon nitride, and silicon oxynitride. When the substrate 100 is viewed in a plan view (hereinafter, referred to as "viewed in the plan view"), each of the active patterns ACT may have a bar shape, and may be disposed such that its major axis lies in a first direction D1 that intersects both of a second direction D2 and a third direction D3 that crosses the second direction D2. For example, the bar shape may extend lengthwise in the first direction D1. The first to third directions D1 to D3 may be coplanar lines that lie on the same plane parallel to a top surface of the substrate 100 or a bottom surface thereof.

The substrate 100 may be provided therein with word lines WL that run across the active patterns ACT. The word lines WL may extend in the second direction D2 and may be arranged along (i.e., spaced apart from each other in) the third direction D3. The word lines WL may be disposed in grooves formed on the device isolation pattern 102 and the active patterns ACT. Each of the word lines WL may have a curved bottom surface. The present inventive concept is not limited thereto. For example, each of the word lines WL may have an uneven bottom surface. The bottom surface of the word line WL on the device isolation pattern 102 may be lower than the bottom surface of the word line WL on the active pattern ACT. The word line WL may include or may be formed of a conductive material. For example, the conductive material may include or may be formed of one of doped semiconductor materials (doped silicon, doped germanium, etc.), conductive metal nitrides (titanium nitride, tantalum nitride, etc.), metals (tungsten, titanium, tantalum, etc.), and metal-semiconductor compounds (tungsten silicide, cobalt silicide, titanium silicide, etc.). A gate dielectric pattern 105 may be interposed between the word line WL and the active patterns ACT and between the word line WL and the device isolation pattern 102. The gate dielectric pattern 105 may include or may be formed of at least one selected from silicon oxide, silicon nitride, silicon oxynitride, and high-k dielectric.

A word-line capping pattern 110 may be disposed on each of the word lines WL. The word-line capping patterns 110 may have their linear shapes that extend along longitudinal directions of the word lines WL, and may cover entire top surfaces of the word lines WL. For example, the word-line capping pattern 110 may include or may be formed of at least one of silicon oxide, silicon nitride, and silicon oxynitride. The word-line capping pattern 110 may have a top surface substantially coplanar with that of the substrate 100.

Each of the active patterns ACT may be provided thereon with a first impurity region 112a and second impurity regions 112b that are spaced apart from each other across the first impurity region 112a. The first impurity region 112a may be provided in one active pattern ACT between a pair of word lines WL that runs across the one active pattern ACT. The second impurity regions 112b (e.g., two second impurity regions 112b) may be provided in the active pattern ACT and may be spaced apart from each other across the pair of word lines WL. For example, the first impurity region 112a may be provided in the active pattern ACT on one side of one word line WL, and the second impurity region 112b may be provided in the active pattern ACT on another side of the one word line WL. The first impurity region 112a may include impurities whose conductivity type is the same as that of the second impurity regions 112b.

An interlayer dielectric layer 120 may be disposed on the substrate 100. The interlayer dielectric layer 120 may be formed as a single or multiple layer including one or more of a silicon oxide layer, a silicon nitride layer, and a silicon oxynitride layer. When viewed in the plan view, the interlayer dielectric layer 120 may have island shapes spaced apart from each other. The interlayer dielectric layer 120 may be formed to simultaneously cover end portions of two neighboring active patterns ACT. The substrate 100, the device isolation pattern 102, and the word-line capping pattern 110 may be partially recessed at their upper portions to form a first recess 122. The first recess 122 may have a net shape when viewed in the plan view.

The substrate 100 may be provided thereon with bit lines BL that extend in the third direction D3 and are spaced apart from each other in the second direction D2. The bit lines BL may be disposed on the interlayer dielectric layer 120, and may run across the word-line capping patterns 110 and the word lines WL. Each of the bit lines BL may include or may be formed of a first bit-line pattern 150, a bit-line barrier pattern 151, and a second bit-line pattern 152. The first bit-line pattern 150 may include or may be formed of impurity-doped polysilicon or impurity-undoped polysilicon. The bit-line barrier pattern 151 may include or may be formed of a metal silicide layer. The second bit-line pattern 152 may include or may be formed of a metallic material or a conductive metal nitride. For example, the metallic material may include or may be formed of at least one selected from tungsten, titanium, tantalum, aluminum, copper, nickel, and cobalt, and the conductive metal nitride may include or may be formed of at least one selected from titanium nitride, tantalum nitride, and tungsten nitride. A bit-line capping pattern 155 may be disposed on each of the bit lines BL. The bit-line capping pattern 155 may extend in the third direction D3 along the bit lines BL to cover top surfaces of the bit lines BL. The bit-line capping pattern 155 may include or may be formed of a dielectric material. For example, the bit-line capping pattern 155 may include or may be formed of one or more of nitride (e.g., silicon nitride), and oxynitride (e.g., silicon oxynitride).

Bit-line contacts DC may be disposed in the first recess 122 that intersect the bit lines BL. The bit-line contacts DC may include or may be formed of impurity-doped polysilicon or impurity-undoped polysilicon. Each of the bit lines BL may be electrically connected through the bit-line contact DC to the first impurity region 112a. According to some example embodiments, the first bit-line pattern 150 and the bit-line contact DC may include or may be formed of the same material, and may contact each other to constitute a single piece. The bit-line contact DC may penetrate at least a portion of the substrate 100 to contact the first impurity region 112a. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). The bit-line contact DC may have a bottom surface lower than the top surface of the substrate 100.

According to some example embodiments, the bit line BL and the bit-line contact DC may have their widths in the second direction D2, and the width of the bit line BL may be substantially the same as the width of the bit-line contact DC. In this description, the term "width" may indicate a distance measured along the second direction D2.

The first recess 122 may have an empty space not occupied by the bit-line contact DC, and a lower buried pattern 141 may be disposed in the empty space of the first recess 122. The lower buried pattern 141 may be formed as a single or multiple layer including or being formed of at least one selected from a silicon oxide layer, a silicon nitride layer, and a silicon oxynitride layer. A dielectric liner 140 may be interposed between the lower buried pattern 141 and an inner sidewall of the first recess 122 and between the lower buried pattern 141 and the bit-line contact DC. The dielectric liner 140 may include or may be formed of a dielectric material having etch selectivity with respect to the lower buried pattern 141. For example, the lower buried pattern 141 may include or may be formed of silicon nitride, and the dielectric liner 140 may include or may be formed of silicon oxide.

Storage node contacts BC may be disposed on opposite sides of each of the bit lines BL. The storage node contacts BC may be spaced apart from each other across their corresponding bit line BL. The storage node contacts BC may include or may be formed of impurity-doped polysilicon or impurity-undoped polysilicon. The storage node contacts BC may have concave bottom surfaces. A dielectric fence 300 may be disposed between the storage node contacts BC and between the bit lines BL. For example, the dielectric fence 300 may be disposed between two storage node contacts BC spaced apart from each other in third direction D3, and between two bit lines BL spaced apart from each other in the second direction D2. The dielectric fence 300 may include or may be formed of a dielectric material, such as silicon nitride, silicon oxide, or silicon oxynitride. One bit line BL may be provided on its one side with the storage node contacts BC and the dielectric fence 300 that are disposed alternately and repeatedly along the bit line BL. The dielectric fence 300 may have a top end whose height (or level) is higher than that of a top end of each of the storage node contacts BC.

A first spacer 210, an air gap AG, and a second spacer 230 may be interposed between the bit line BL and the storage node contact BC as shown in the cross-sectional view taken line I-I' of FIG. 1B. The first spacer 210, the air gap AG, and the second spacer 230 may be collectively called a bit-line spacer SP. For example, the bit-line spacer SP may be disposed on each of opposite sidewalls of the bit line BL. The first spacer 210 may be adjacent to the sidewall of the bit line BL, and the second spacer 230 may be adjacent to the storage node contact BC. The air gap AG may be interposed between the first spacer 210 and the second spacer 230. The first spacer 210, the air gap AG, and the second spacer 230 may extend along a lateral surface of the bit line BL, and may also be interposed between the bit line BL and the dielectric fence 300 as shown in the cross-sectional view taken line II-II' of FIG. 1B. The first spacer 210 and the second spacer 230 may include or may be formed of the same material. For example, the first and second spacers 210 and 230 may include or may be formed of silicon nitride. The top surface of the storage node contact BC may be lower than an uppermost surface of the second spacer 230, and may expose an upper sidewall of the second spacer 230. For example, the upper sidewall of the second spacer 230 may vertically extend beyond the top surface of the storage node contact BC. The dielectric pattern 250 may have a top surface whose height (or level) is lower than that of the uppermost surface of the second spacer 230. The second spacer 230 may have the uppermost surface whose height (or level) is higher than that of the top surface of the bit line BL. The air gap AG may have an uppermost surface whose height (or level) is higher than that of the top surface of the bit line BL. The second spacer 230 may have a bottom surface lower than that of the first spacer 210. The uppermost surface of the second spacer 230 may be lower than that of the first spacer 210. Such configuration of the first spacer 210 and the second spacer 230 may increase a process margin for forming a landing pad LP which will be discussed below and improve connection between the landing pad LP and the storage node contact BC to each other. According to some example embodiments, the first spacer 210 may have the uppermost surface at substantially the same height (or level) as that of the uppermost surface of the second spacer 230.

The first spacer 210 may extend to cover a sidewall of the bit-line contact DC, and the inner sidewall and a bottom surface of the first recess 122. The first spacer 210 may be interposed between the bit-line contact DC and the dielectric liner 140, between the dielectric liner 140 and the inner sidewall of the first recess 122, between the dielectric liner 140 and the bottom surface of the first recess 122, and between the word-line capping pattern 110 and the dielectric liner 140. For example, the first spacer 210 may be interposed between the substrate 100 and the dielectric liner 140 and between the device isolation pattern 102 and the dielectric liner 140.

A dielectric pattern 250 may be interposed between the bit-line spacer SP and the storage node contact BC. For example, the dielectric pattern 250 may be interposed between the second spacer 230 and the storage node contact BC. The dielectric pattern 250 may cover a sidewall of the second spacer 230 and a sidewall of the storage node contact BC. The dielectric pattern 250 may be interposed between the storage node contact BC and the dielectric fence 300. The dielectric pattern 250 may cover a sidewall of the dielectric fence 300. For example, when viewed in the plan view, the dielectric pattern 250 may have a tetragonal ring-shaped structure or a circular ring-shaped structure.

The dielectric pattern 250 may have a top surface substantially coplanar with that of the storage node contact BC. When viewed in the plan view, the dielectric pattern 250 may surround the storage node contact BC. For example, the dielectric pattern 250 may contact and surround an entire sidewall of the storage node contact BC. The dielectric pattern 250 may have a bottom surface substantially coplanar with the top surface of the substrate 100. For example, the bottom surface of the dielectric pattern 250 may be substantially coplanar with top surfaces of the active patterns ACT. The storage node contact BC may have a stepped part. The stepped part may be formed on the top surface of the substrate 100. The storage node contact BC may have a width that is larger at a portion adjacent to a bottom surface of the substrate 100 than at a portion adjacent to the top surface of the substrate 100. The dielectric pattern 250 may have a width less than that of the second spacer 230. The dielectric pattern 250 may include or may be formed of a material different from that of the first and second spacers 210 and 230. The dielectric pattern 250 may include or may be formed of oxide, such as silicon oxide or hafnium oxide. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

At an interface between a storage node contact including polysilicon and a second spacer including silicon nitride, dangling bonds may be formed to increase depletion in the storage node contact. For example, alpha particles with high energy which irradiate the semiconductor memory device may form dangling bonds at the interface between polysilicon and silicon nitride. Such formation of the dangling bonds may cause a depletion layer where free electrons in the storage node contact are diffused away therefrom to expand, and thus effective width of the storage node contact (i.e., a contact area between the storage node contact and a landing pad) decreases, thereby increasing contact resistance between the landing pad and the storage node contact. A short channel effect may cause a semiconductor memory device to have reduced reliability and electrical characteristics.

According to the present inventive concepts, because the dielectric pattern 250, which may include or may be formed of silicon oxide or hafnium oxide, is interposed between the storage node contact BC and the second spacer 230, an interface between polysilicon and silicon oxide or hafnium oxide may be formed, and dangling bonds due to alpha particles, for example, may be only rarely formed or may be prevented from being formed at the interface between the storage node contact BC and the second spacer 230. Thus, the occurrence of depletion at the storage node contact BC may be prevented, and reduction of effective width of the storage node contact BC may be avoided. A semiconductor memory device according to the present inventive concepts may increase in reliability and electrical characteristics.

A landing pad LP may be disposed on the storage node contact BC. A portion of the bit line BL may vertically overlap the landing pad LP. The storage node contacts BC and the landing pads LP may serve to achieve connection between the active patterns ACT and capacitor bottom electrodes BE formed on the bit lines BL. The landing pads LP may be disposed to correspondingly overlap the storage node contacts BC. The landing pad LP may include or may be formed of a metallic material, for example, tungsten.

A conductive barrier layer 310 may be interposed between the storage node contact BC and the landing pad LP, between the bit-line spacer SP and the landing pad LP, and between the bit line BL and the landing pad LP. The conductive barrier layer 310 may conformally cover the bit line BL, the storage node contact BC, and the bit-line spacer SP. The conductive barrier layer 310 may include or may be formed of metal nitride, such as titanium nitride or tantalum nitride.

A second recess 312 may be formed on the bit-line capping pattern 155 and between the landing pads LP. The second recess 312 may share a sidewall of the landing pad LP as an inner sidewall thereof. The second recess 312 may have a bottom surface spaced apart from the bit line BL. The second recess 312 may expose the sidewall of the landing pad LP. The second recess 312 may separate the landing pads LP from each other in the second direction D2 and the third direction D3.

An upper buried pattern 320 may be disposed in the second recess 312. The upper buried pattern 320 may fill a space between the landing pads LP. The upper buried pattern 320 may have a top surface substantially coplanar with that of the landing pad LP. The upper buried pattern 320 may include or may be formed of silicon oxide, silicon nitride, or a combination thereof.

A semiconductor memory device according to some example embodiments of the present inventive concepts may include data storage elements. Each of the data storage elements may be a capacitor. For example, the data storage elements may include bottom electrodes BE, a top electrode TE that covers the bottom electrodes BE, and a dielectric layer 330 between the bottom electrodes BE and the top electrode TE. The bottom electrode BE may be disposed on the landing pad LP. The top electrode TE may be a common electrode that commonly covers the bottom electrodes BE. According to some example embodiments, each of the bottom electrodes BE may have a hollow cylindrical shape or a pillar shape. The dielectric layer 330 may conformally cover a top surface and sidewalls of each of the bottom electrodes BE.

The bottom electrodes BE and the top electrode TE may include or may be formed of one of impurity-doped silicon, metals, and metal compounds. The dielectric layer 330 may be a single layer, or a combination thereof, including or being formed of at least one metal oxide, such as $HfO_2$, $ZrO_2$, $Al_2O_3$, $La_2O_3$, $Ta_2O_3$, and $TiO_2$, and/or perovskite dielectric materials, such as $SrTiO_3$(STO), $(Ba,Sr)TiO_3$ (BST), $BaTiO_3$, PZT, and PLZT.

FIGS. 2A to 10A illustrate plan views showing a method of fabricating a semiconductor memory device according to some example embodiments of the present inventive concepts. FIGS. 2B to 10B illustrate cross-sectional views taken along line I-I' and II-II' of FIGS. 2A to 10A, respectively.

Figure 2A:
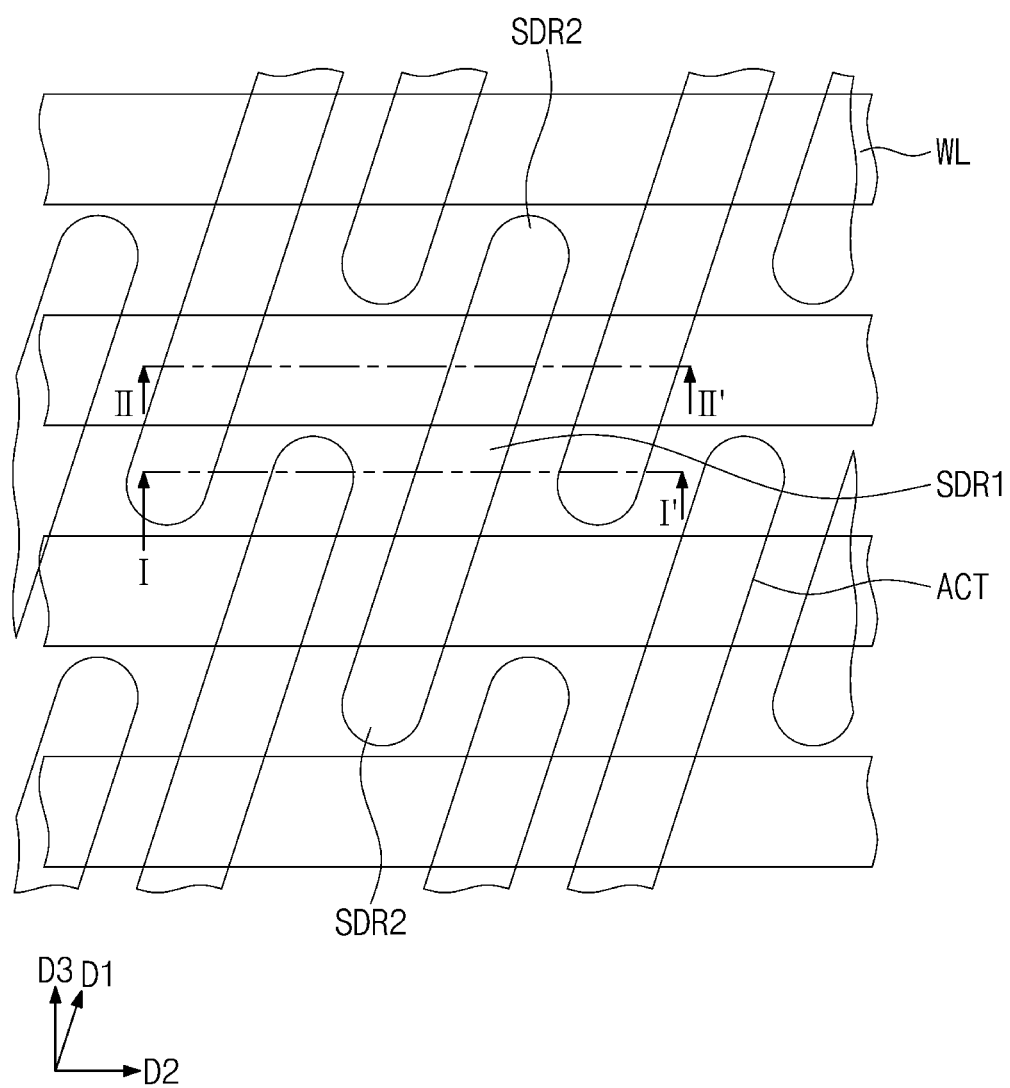
Figure 2B:
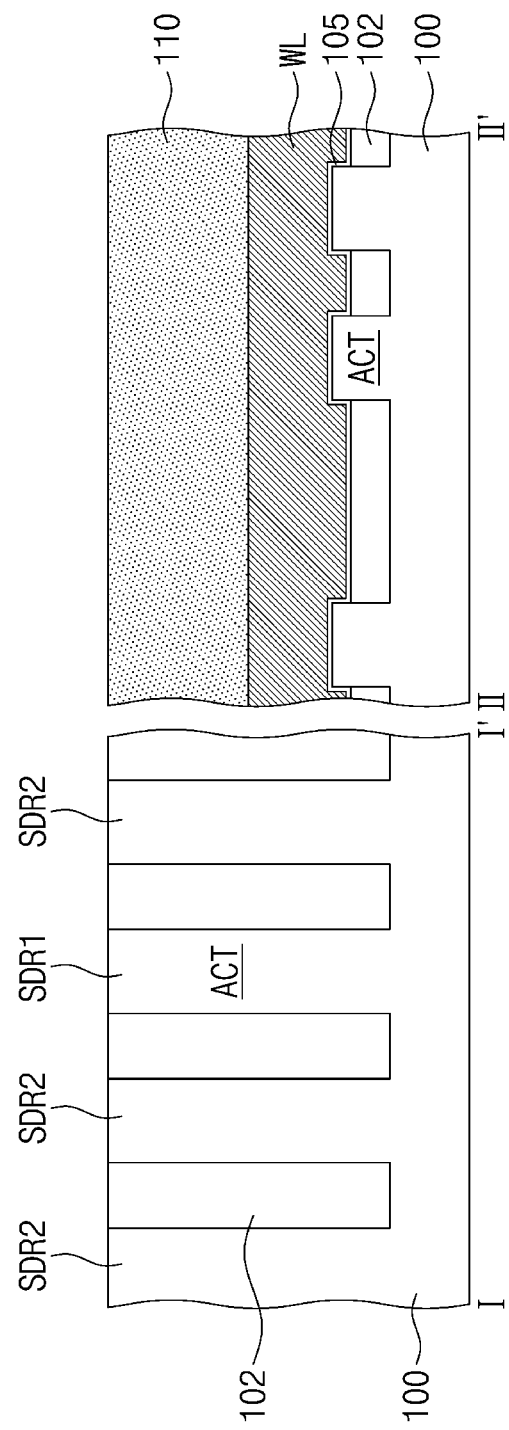

Referring to FIGS. 2A and 2B, a device isolation pattern 102 may be formed in a substrate 100, defining active patterns ACT. For example, a trench may be formed at a cell array region of the substrate 100, and the device isolation pattern 102 may fill the trench. The device isolation pattern 102 may be formed by using a shallow trench isolation (STI) method. The device isolation pattern 102 may include or may be formed of at least one selected from silicon oxide, silicon nitride, and silicon oxynitride. When viewed in the plan view, each of the active patterns ACT may have a bar shape, and its major axis may lie in a first direction D1 that intersects both a second direction D2 and a third direction D3 that crosses the second direction D2. For example, the bar shape may extend lengthwise in the first direction D1. The first to third directions D1 to D3 may be coplanar lines that lie on the same plane parallel to a top surface of the substrate 100 or a bottom surface thereof.

Word lines WL may be formed in corresponding grooves formed in the substrate 100. A pair of word lines WL may run across each of the active patterns ACT. The pair of word lines WL may divide each of the active patterns ACT into a first source/drain region SDR1 and a pair of second source/drain regions SDR2. The first source/drain region SDR1 may be defined between the pair of word lines WL, and the pair of second source/drain regions SDR2 may be defined on opposite edges (i.e., end portions) of each of the corresponding active patterns ACT.

The substrate 100 may be patterned to form the grooves that linearly extend in the second direction D2. A gate dielectric layer may be formed on the substrate 100 in which the grooves are formed. The gate dielectric layer may be formed by using a thermal oxidation process, an atomic layer deposition process, or a chemical vapor deposition process. The gate dielectric layer may include or may be formed of a dielectric material, for example, one or more of silicon oxide, silicon nitride, and metal oxide. A gate electrode layer may be formed on the substrate 100 on which the gate dielectric layer is formed. The gate electrode layer may be formed by using a chemical vapor deposition process. The gate electrode layer may include or may be formed of one of doped semiconductor materials (doped silicon, doped germanium, etc.), conductive metal nitrides (titanium nitride, tantalum nitride, etc.), metals (tungsten, titanium, tantalum, etc.), and metal-semiconductor compounds (tungsten silicide, cobalt silicide, titanium silicide, etc.). An etching process may be performed such that the gate electrode layer is etched to form the word lines WL in corresponding grooves. The etching process may continue until the gate electrode layer has a certain thickness in the grooves. Portions of the gate dielectric layer which are exposed without being covered with the word lines WL may be removed to form a gate dielectric pattern 105. The gate dielectric pattern 105 may be formed to be disposed between the word lines WL and the active patterns ACT and/or between the word lines WL and the device isolation pattern 102. The etching process may expose a top surface of the device isolation pattern 102 and top surfaces of the active patterns ACT. A word-line capping layer may be formed on the substrate 100, and then a planarization process may be performed to form a word-line capping pattern 110 in each of the grooves. The word-line capping layer may include or may be formed of a dielectric material, for example, silicon nitride.

Figure 3A:
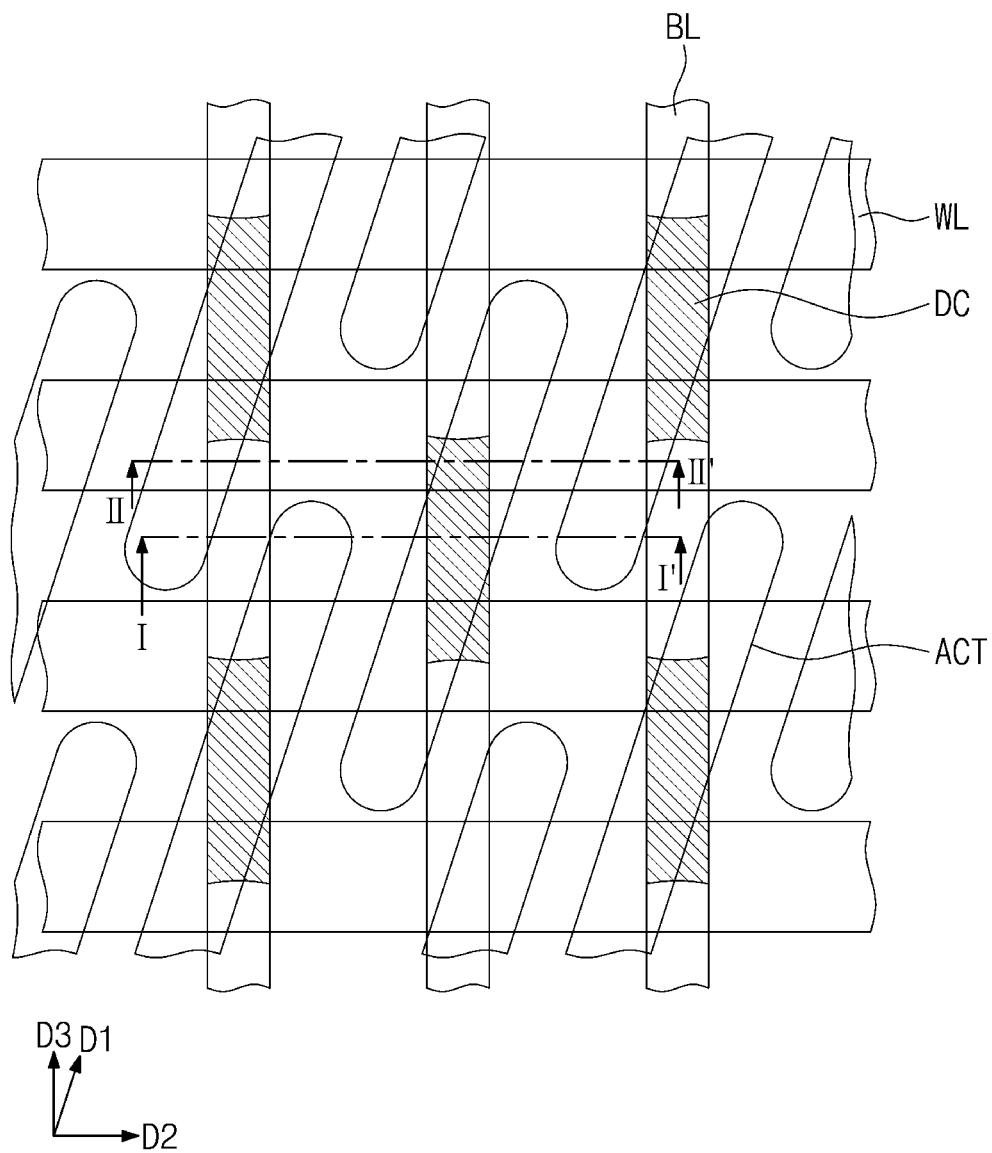
Figure 3B:
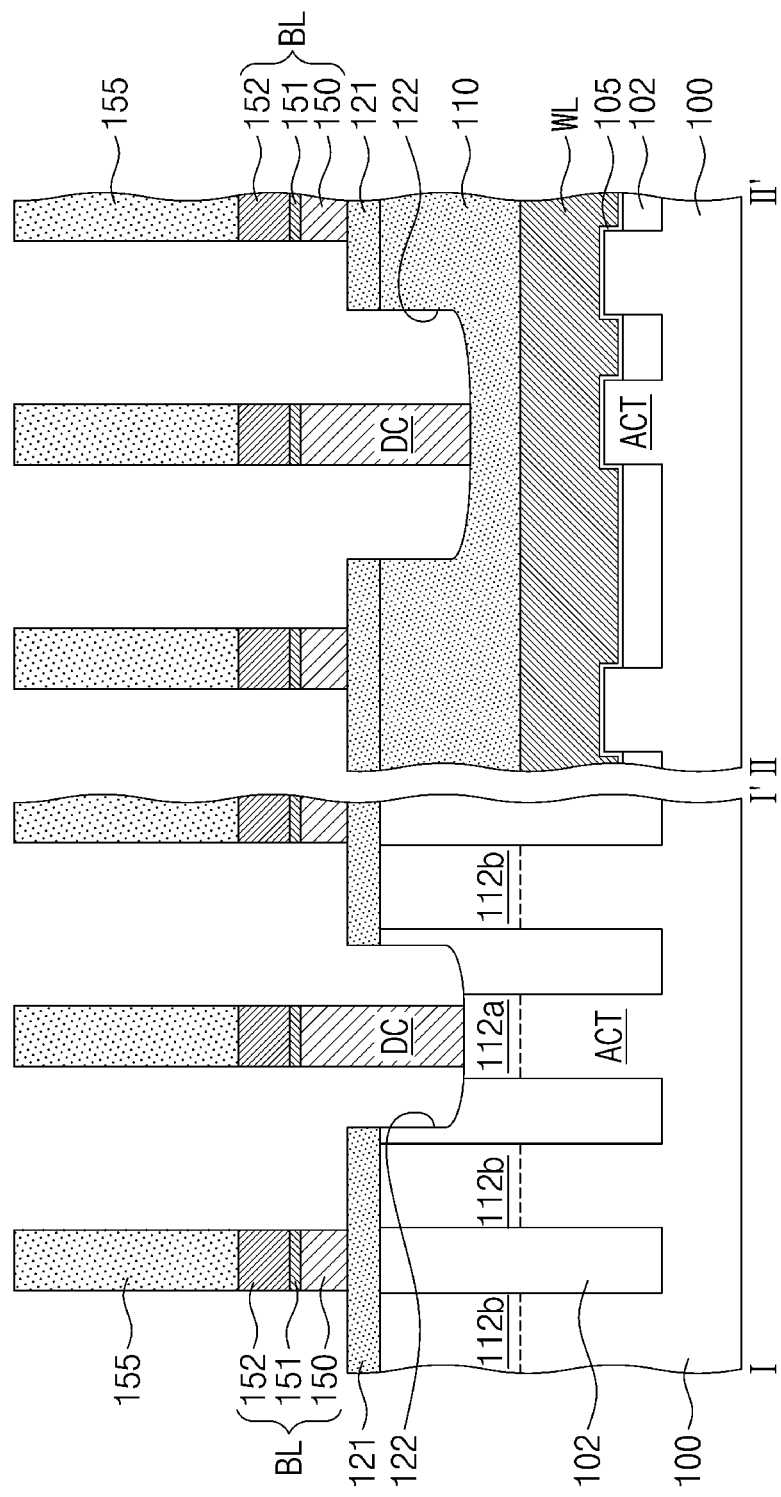

Referring to FIGS. 3A and 3B, each of the active patterns ACT may be implanted with impurities to form a first impurity region 112a and second impurity regions 112b. The first and second impurity regions 112a and 112b may be formed by an ion implantation process. For example, the first and second impurity regions 112a and 112b may be areas doped with n-type impurities. The first impurity region 112a may extend relatively deeper into the substrate 100 than the second impurity regions 112b. The first and second impurity regions 112a and 112b may be respectively formed in the first and second source/drain regions SDR1 and SDR2.

An interlayer dielectric layer and a first bit-line layer may be formed on the entire surface of the substrate 100. The first bit-line layer may include or may be formed of polysilicon. The first bit-line layer may be used as an etching mask to etch the interlayer dielectric layer, the device isolation pattern 102, the substrate 100, and the word-line capping pattern 110 to simultaneously form a first recess 122 and a preliminary interlayer dielectric layer 121. The preliminary interlayer dielectric layer 121 may be formed as a single or multiple layer including or being formed of at least one selected from a silicon oxide layer, a silicon nitride layer, and a silicon oxynitride layer. When viewed in the plan view, the preliminary interlayer dielectric layer 121 may be shaped like a plurality of islands that are spaced apart from each other. The preliminary interlayer dielectric layer 121 may be formed to simultaneously cover end portions of two neighboring active patterns ACT. The first recess 122 may have a net shape when viewed in the plan view. The first recess 122 may expose the first impurity region 112a.

A bit-line contact layer may be formed on the entire surface of the substrate 100, filling the first recess 122. For example, the bit-line contact layer may include or may be formed of polysilicon. The bit-line contact layer may undergo a planarization process to remove the bit-line contact layer on the first bit-line layer and to expose a top surface of the first bit-line layer. A bit-line barrier layer, a second bit-line layer, and a bit-line capping layer may be sequentially formed on the first bit-line layer and the bit-line contact layer. The bit-line barrier layer may include or may be formed of a metal silicide layer. The second bit-line layer may include or may be formed of metal (e.g., tungsten, titanium, tantalum, aluminum, copper, nickel, or cobalt) or conductive metal nitride (e.g., titanium nitride, tantalum nitride, or tungsten nitride). The bit-line capping layer may include or may be formed of one or more of nitride (e.g., silicon nitride) and oxynitride (e.g., silicon oxynitride). An etching process may be performed such that the bit-line capping layer, the second bit-line layer, the bit-line barrier layer, the first bit-line layer, and the bit-line contact layer are sequentially etched to form a bit-line capping pattern 155, a second bit-line pattern 152, a bit-line barrier pattern 151, a first bit-line pattern 150, and a bit-line contact DC, respectively. The first bit-line pattern 150, the bit-line barrier pattern 151, and the second bit-line pattern 152 may be collectively called a bit line BL. The etching process may partially expose a top surface of the preliminary interlayer dielectric layer 121 and may also partially expose an inner sidewall and a bottom surface of the first recess 122.

Figure 4A:
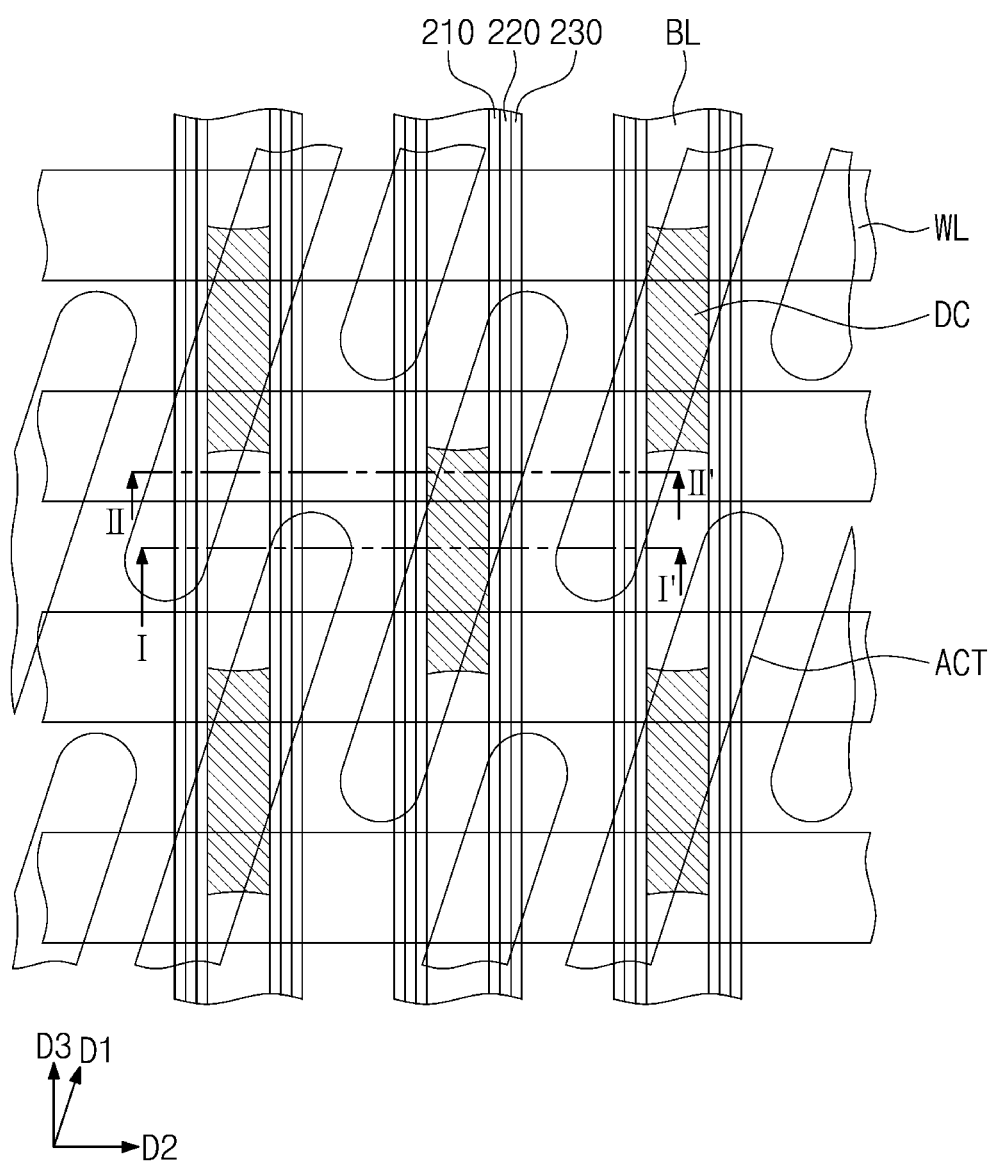
Figure 4B:
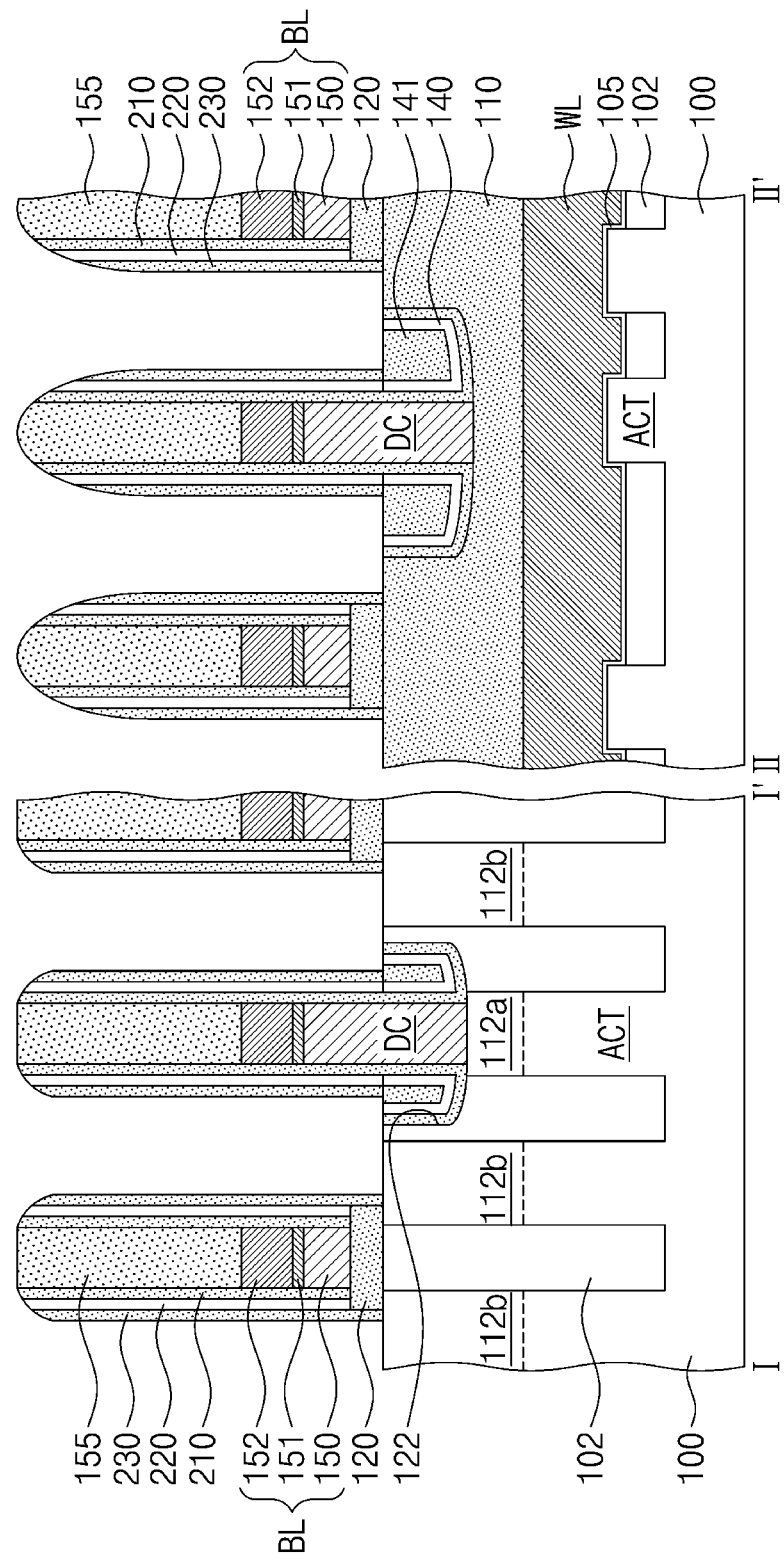

Referring to FIGS. 4A and 4B, a first spacer layer may be formed on the entire surface of the substrate 100. The first spacer layer may conformally cover the bottom surface and the inner sidewall of the first recess 122. The first spacer layer may include or may be formed of silicon nitride. A dielectric liner layer and a buried dielectric layer may be sequentially formed on the entire surface of the substrate 100 so as to fill the first recess 122, and then an anisotropic etching process may be performed such that the dielectric liner layer and a buried dielectric layer are anisotropically etched to form a dielectric liner 140 and a lower buried pattern 141 in the first recess 122. The dielectric liner 140 may include or may be formed of silicon oxide, and the lower buried pattern 141 may include or may be formed of silicon nitride. When the anisotropic etching process is performed, the first spacer layer may be etched to form a first spacer 210. A sacrificial spacer layer may be conformally formed on the entire surface of the substrate 100, and may then be anisotropically etched to form a sacrificial spacer 220 that covers a sidewall of the first spacer 210. The sacrificial spacer 220 may include or may be formed of a material, such as silicon oxide, having etch selectivity with respect to the first spacer 210. The preliminary interlayer dielectric layer 121 may be anisotropically etched to form an interlayer dielectric layer 120 and to expose a top surface of the substrate 100. A second spacer layer may be conformally formed on the entire surface of the substrate 100, and may then be anisotropically etched to form a second spacer 230 that covers a sidewall of the sacrificial spacer 220. The second spacer 230 may include silicon nitride.

Figure 5A:
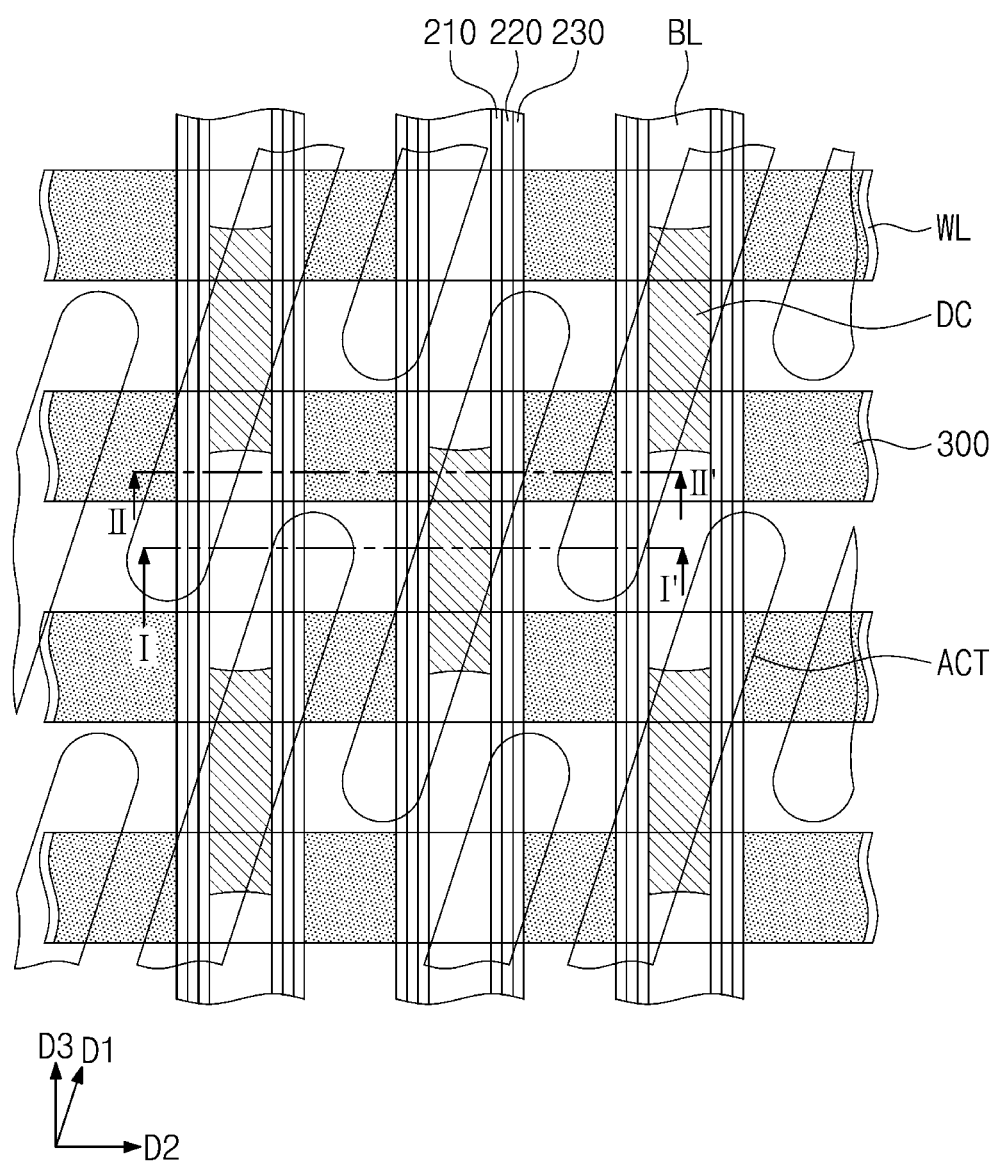
Figure 5B:
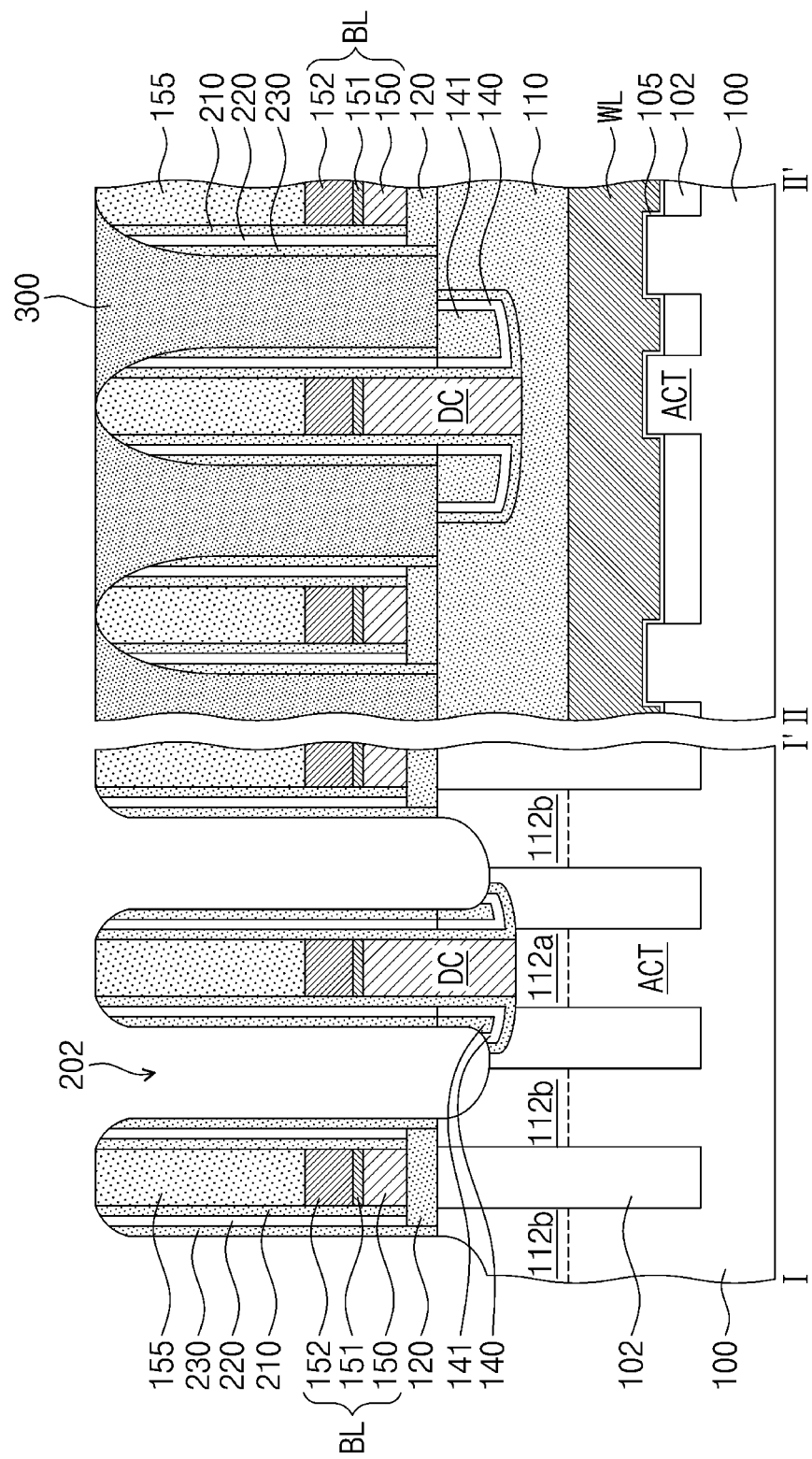

Referring to FIGS. 5A and 5B, sacrificial patterns may be formed on the entire surface of the substrate 100, defining positions of storage node contacts BC which will be discussed below. For example, the sacrificial patterns may include or may be formed of silicon oxide, polysilicon, or silicon germanium. The sacrificial patterns may be separated from each other between the bit lines BL and may vertically overlap the second impurity regions 112b. The sacrificial patterns may be provided therebetween with openings that define positions of dielectric fences 300 which will be discussed below. When the sacrificial patterns are formed, a partial etching may be performed on upper portions of the first spacer 210, the sacrificial spacer 220, and the second spacer 230 that are exposed to the openings. In an embodiment, with an etching condition which is properly controlled using loading effects or the like, damage to the first spacer 210, the sacrificial spacer 220, and the second spacer 230 may be avoided in the partial etching.

The dielectric fences 300 may be formed in the openings. The dielectric fences 300 may include or may be formed of, for example, silicon nitride, silicon oxide, or silicon oxynitride. The dielectric fences 300 may vertically overlap the word lines WL. The sacrificial patterns may be removed, and a third recess 202 may be formed to expose the second impurity region 112b of the substrate 100.

Figure 6A:
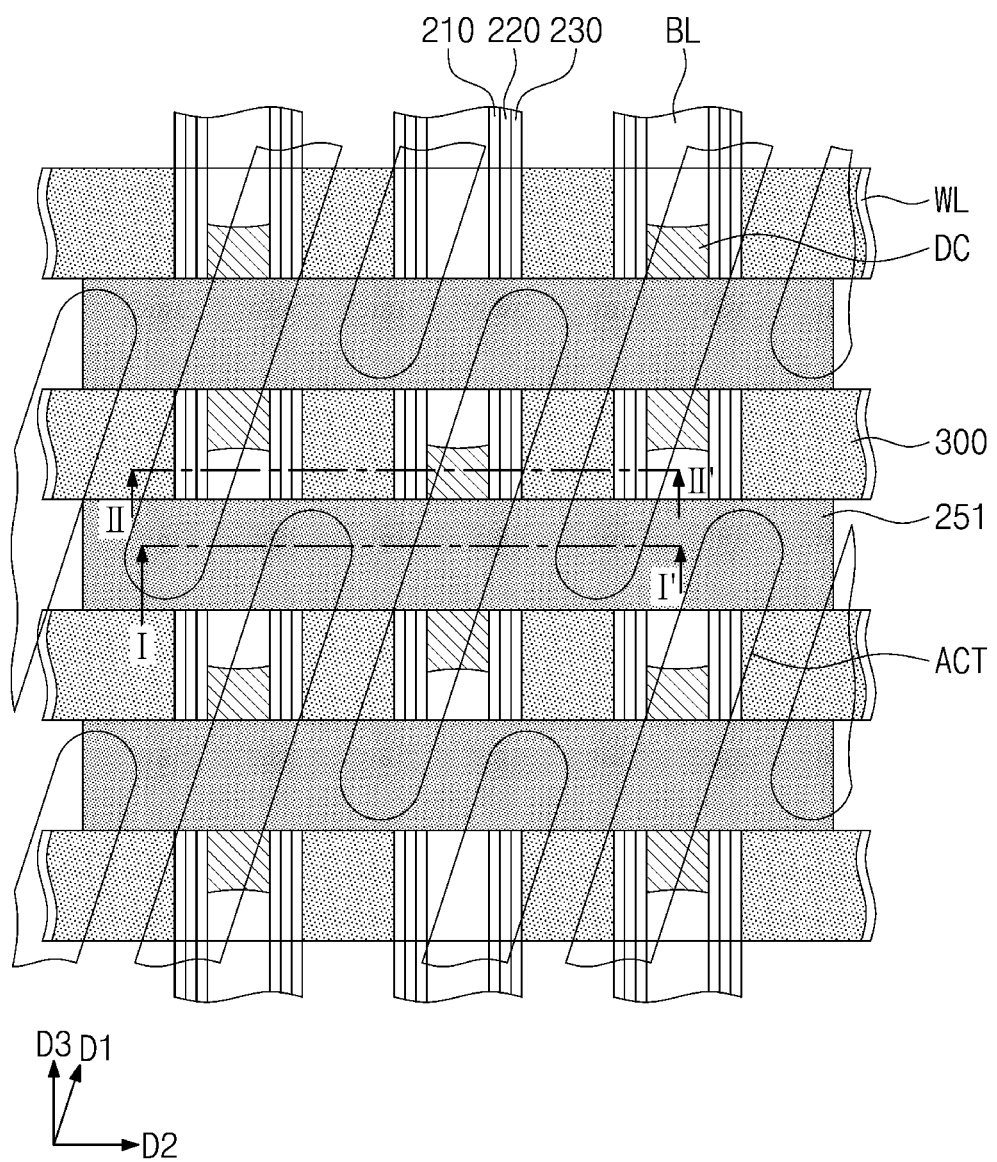
Figure 6B:
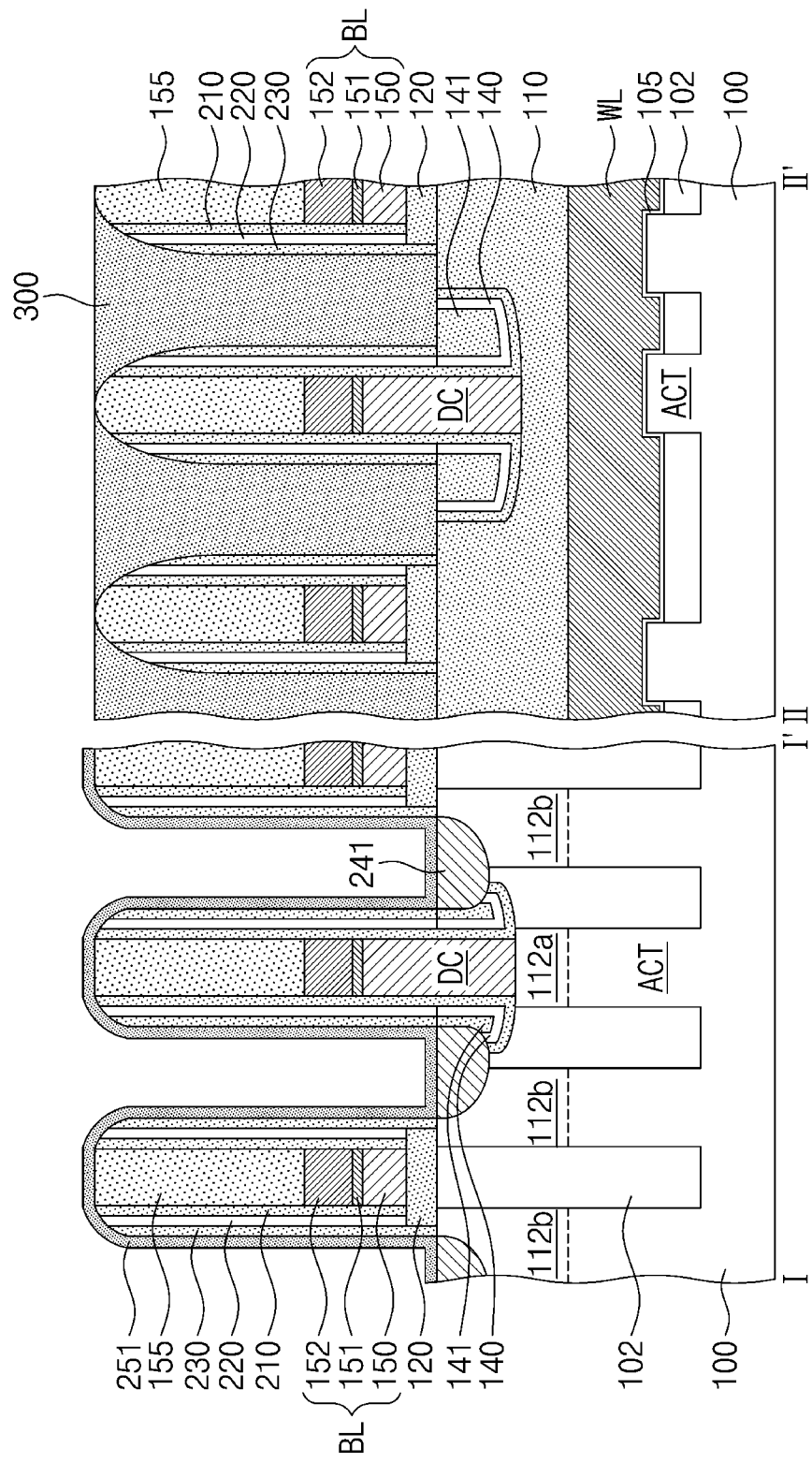

Referring to FIGS. 6A and 6B, a polysilicon layer filing the third recess 202 may be formed on the entire surface of the substrate 100, and may then be etched to from a first preliminary contact 241. The first preliminary contact 241 may fill a portion of the third recess 202. For example, a portion of the polysilicon layer may remain at the bottom of the third recess 202 as the first preliminary contact 241. The first preliminary contact 241 may have a top surface substantially coplanar with that of the substrate 100. For example, the first preliminary contact 241 may expose a sidewall of the second spacer 230.

A first preliminary dielectric layer 251 may be formed on the entire surface of the substrate 100. The first preliminary dielectric layer 251 may conformally cover a sidewall of the second spacer 230, a top surface of the second spacer 230, a top surface of the sacrificial spacer 220, a top surface of the first spacer 210, a top surface of the bit-line capping pattern 155, and a top surface of the first preliminary contact 241. The first preliminary dielectric layer 251 may include or may be formed of oxide, for example, silicon oxide or hafnium oxide.

Figure 7A:
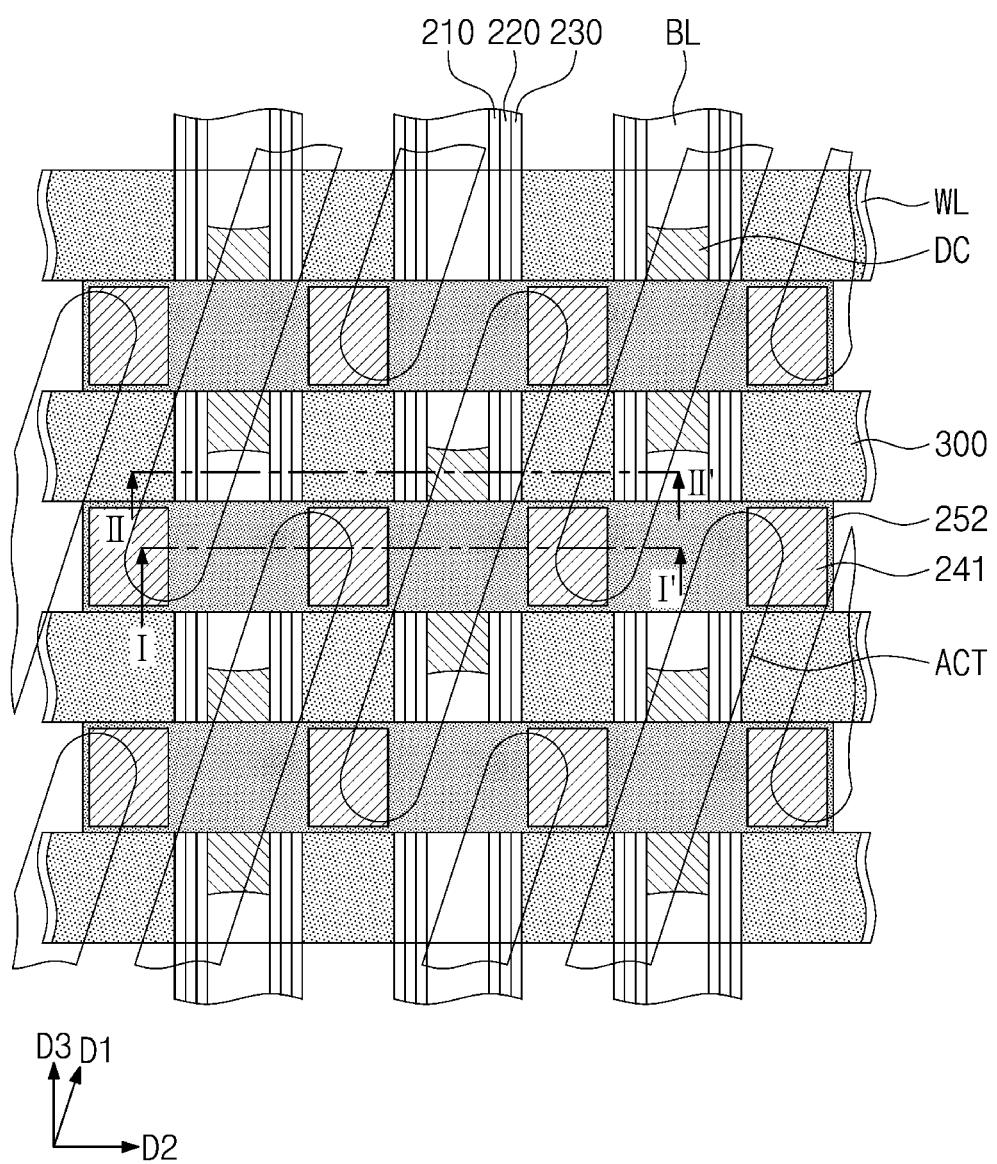
Figure 7B:
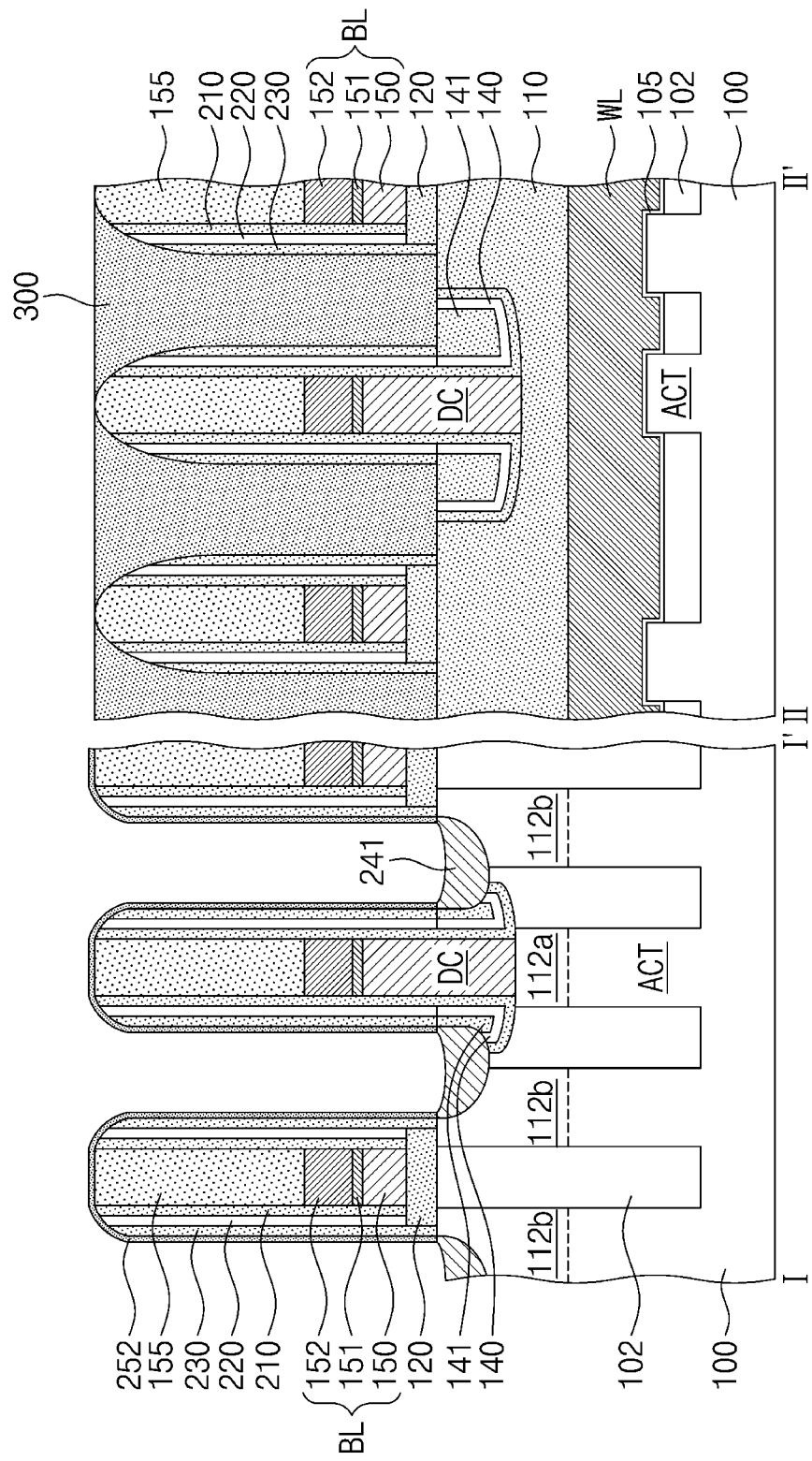

Referring to FIGS. 7A and 7B, an etching process may be performed such that the first preliminary dielectric layer 251 is etched to form a second preliminary dielectric layer 252 and to expose the top surface of the first preliminary contact 241. For example, the first preliminary dielectric layer 251 may be partially removed to reduce its thickness, and the first preliminary dielectric layer 251 which remains after the etching process may correspond to the second preliminary dielectric layer 252. The second preliminary dielectric layer 252 may conformally cover the sidewall of the second spacer 230, the top surface of the second spacer 230, the top surface of the sacrificial spacer 220, the top surface of the first spacer 210, and the top surface of the bit-line capping pattern 155. The second preliminary dielectric layer 252 may have a thickness less than that of the first preliminary dielectric layer 251. In this description, the term "thickness" may indicate a distance measured in a direction perpendicular to the top surface of the substrate 100, which may correspond to top surfaces of the second impurity region 112b, for example. When the etching process is performed, the top surface of the first preliminary contact 241 may be partially etched to become concave. A cleaning process may be performed to remove etching byproducts from the top surface of the first preliminary contact 241.

Figure 8A:
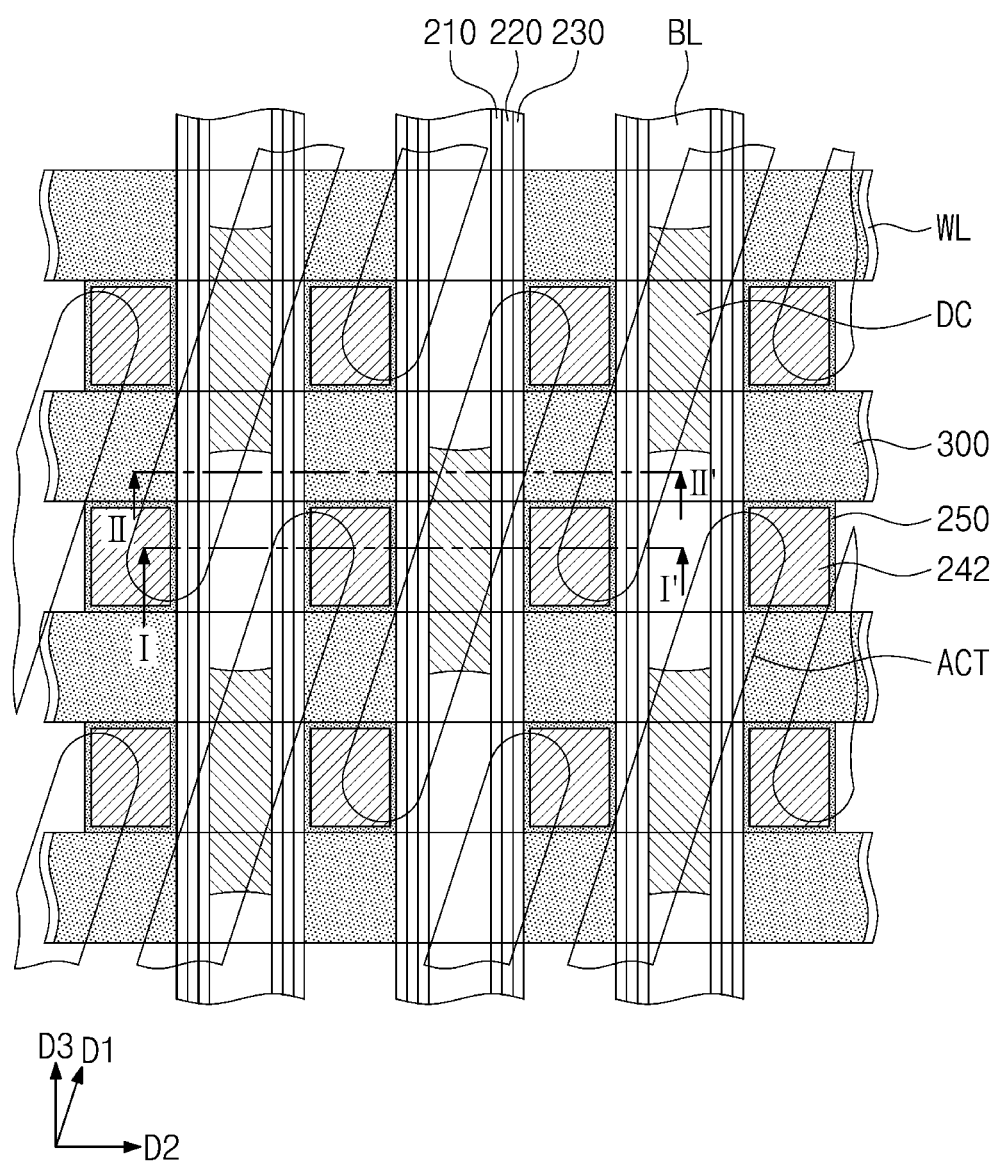
Figure 8B:
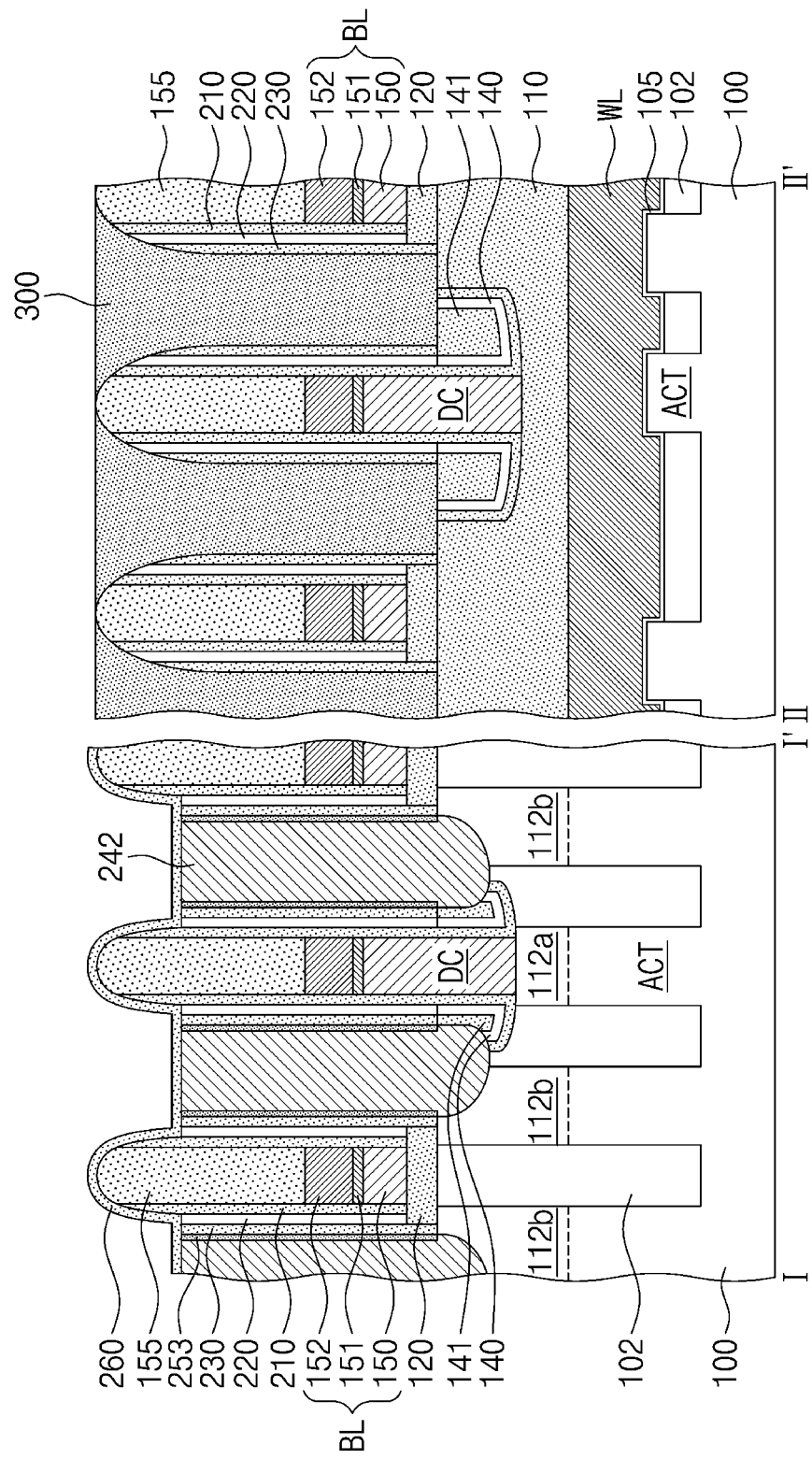

Referring to FIGS. 8A and 8B, a second polysilicon layer may be formed on the entire surface of the substrate 100, and an etching process may be performed to etch the polysilicon layer to form a second preliminary contact 242. The second preliminary contact 242 may include or may be formed of the first preliminary contact 241 and the second polysilicon layer that is stacked and etched on the first preliminary contact 241. The second preliminary contact 242 may have a top surface at a height (or level) lower than that of the top surface of the bit-line capping pattern 155 and that of the top surface of the first spacer 210. The etching process may partially etch upper portions of the bit-line capping pattern 155, the sacrificial spacer 220, and the second spacer 230. An upper portion of the first spacer 210 may also be partially etched to have a small width at the upper portion of the first spacer 210.

When the etching process is performed, the second preliminary dielectric layer 252 may be etched to form a third preliminary dielectric layer 253. The third preliminary dielectric layer 253 may expose the top surfaces of the bit-line capping pattern 155, the first spacer 210, the sacrificial spacer 220, and the second spacer 230. The third preliminary dielectric layer 253 may be interposed between the second spacer 230 and the second preliminary contact 242. The third preliminary dielectric layer 253 may cover the sidewall of the second spacer 230. The third preliminary dielectric layer 253 may have a top surface at substantially the same height (or level) as that of the top surface of the second spacer 230. The height (or level) of the top surface of the third preliminary dielectric layer 253 may be substantially the same as that of the top surface of the second preliminary contact 242. The third preliminary dielectric layer 253 may have a bottom surface substantially coplanar with the top surface of the substrate 100 (e.g., the top surface of the second impurity region 112b). An upper capping layer 260 may be formed on the entire surface of the substrate 100. For example, the upper capping layer 260 may include or may be formed of silicon nitride. The upper capping layer 260 may conformally cover the top surfaces of the second preliminary contact 242, the third preliminary dielectric layer 253, the second spacer 230, the sacrificial spacer 220, and the bit-line capping pattern 155, and may also conformally cover the sidewall of the first spacer 210. The upper capping layer 260 may be formed to prevent damage in a subsequent etching process.

Figure 9A:
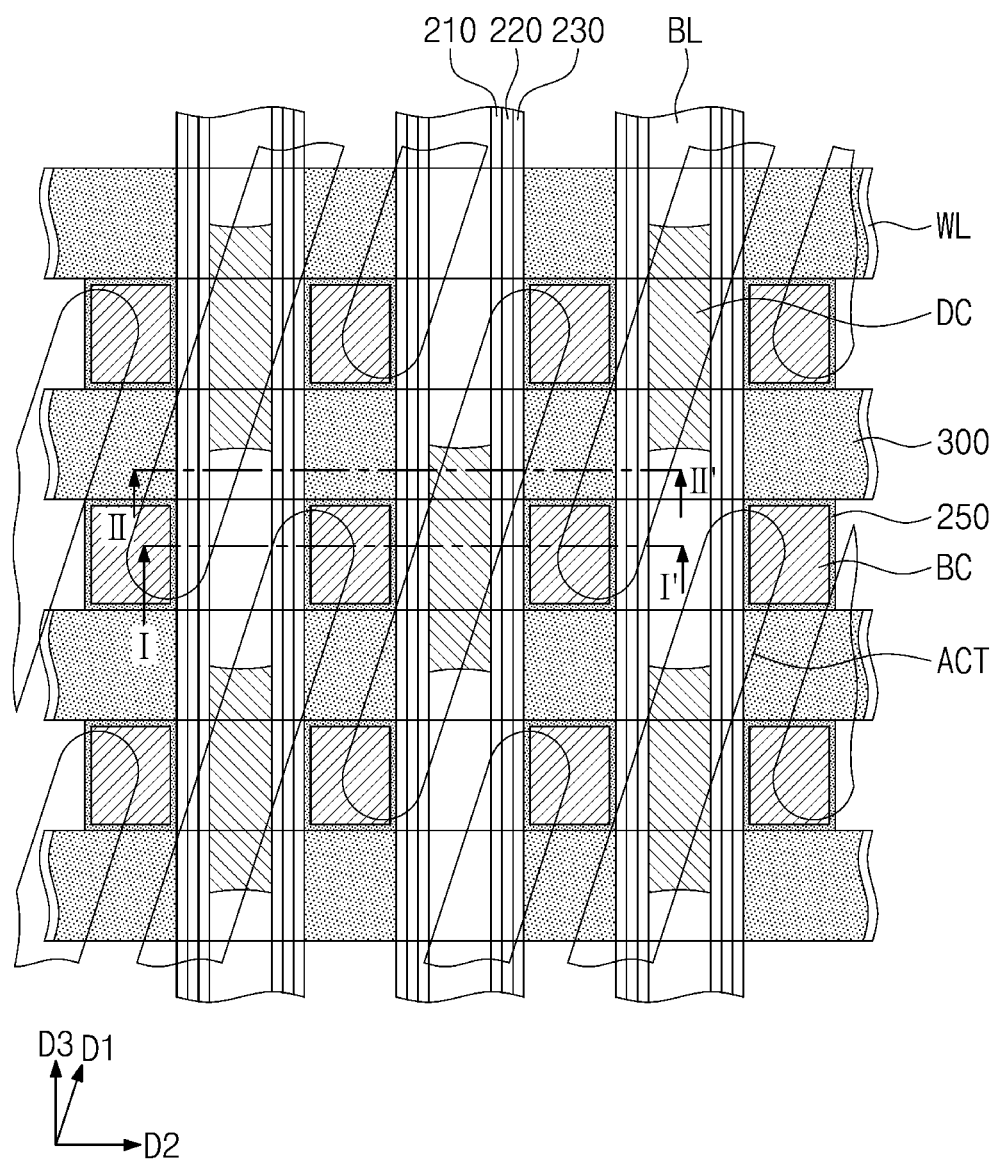
Figure 9B:
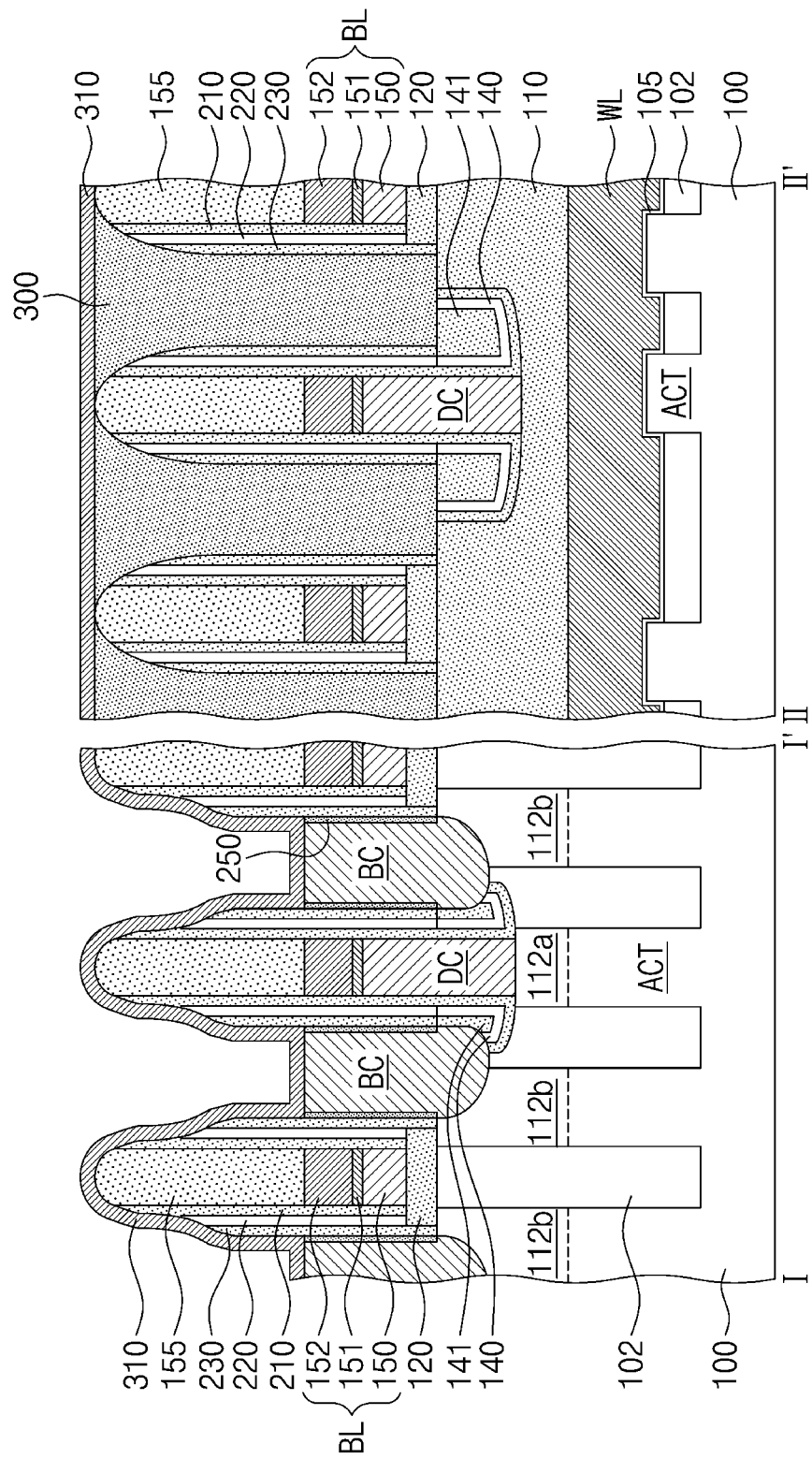

Referring to FIGS. 9A and 9B, an etching process may be performed such that the second preliminary contact 242 is etched to form a storage node contact BC. The etching process may partially etch upper portions of the upper capping layer 260, the sacrificial spacer 220, and the second spacer 230. In the etching process, the third preliminary dielectric layer 253 is etched to form a dielectric pattern 250. The dielectric pattern 250 may expose the sidewall of the second spacer 230. The dielectric pattern 250 may be interposed between the second spacer 230 and the storage node contact BC. For example, the dielectric pattern 250 may cover the sidewall of the second spacer 230 and a sidewall of the storage node contact BC. The dielectric pattern 250 may have a top surface at substantially the same height (or level) as that of a top end of the storage node contact BC. The dielectric pattern 250 may have a bottom surface substantially coplanar with the top surface of the substrate 100. The height (or level) of the top surface of the storage node contact BC may be lower than those of the top surfaces of the bit-line capping pattern 155, the first spacer 210, the sacrificial spacer 220, and the second spacer 230. The first spacer 210 may be exposed at its upper sidewall. The processes mentioned above may increase a process margin for the formation of landing pads which will be discussed above.

A cleaning process may be performed to clean the top surface of the storage node contact BC. A conductive barrier layer 310 may be conformally formed on the entire surface of the substrate 100. For example, the conductive barrier layer 310 may include titanium nitride or tantalum nitride.

Figure 10A:
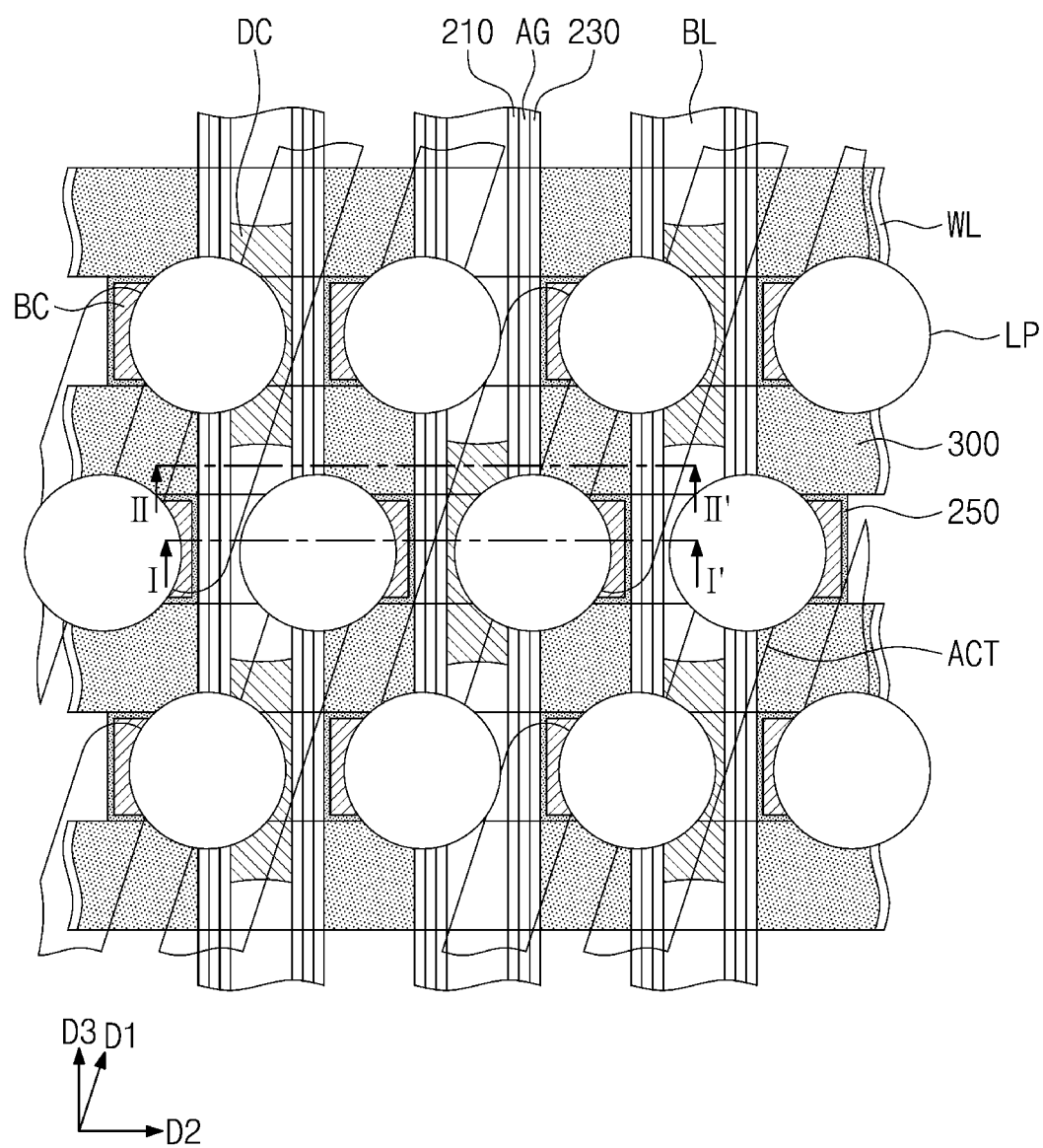
Figure 10B:
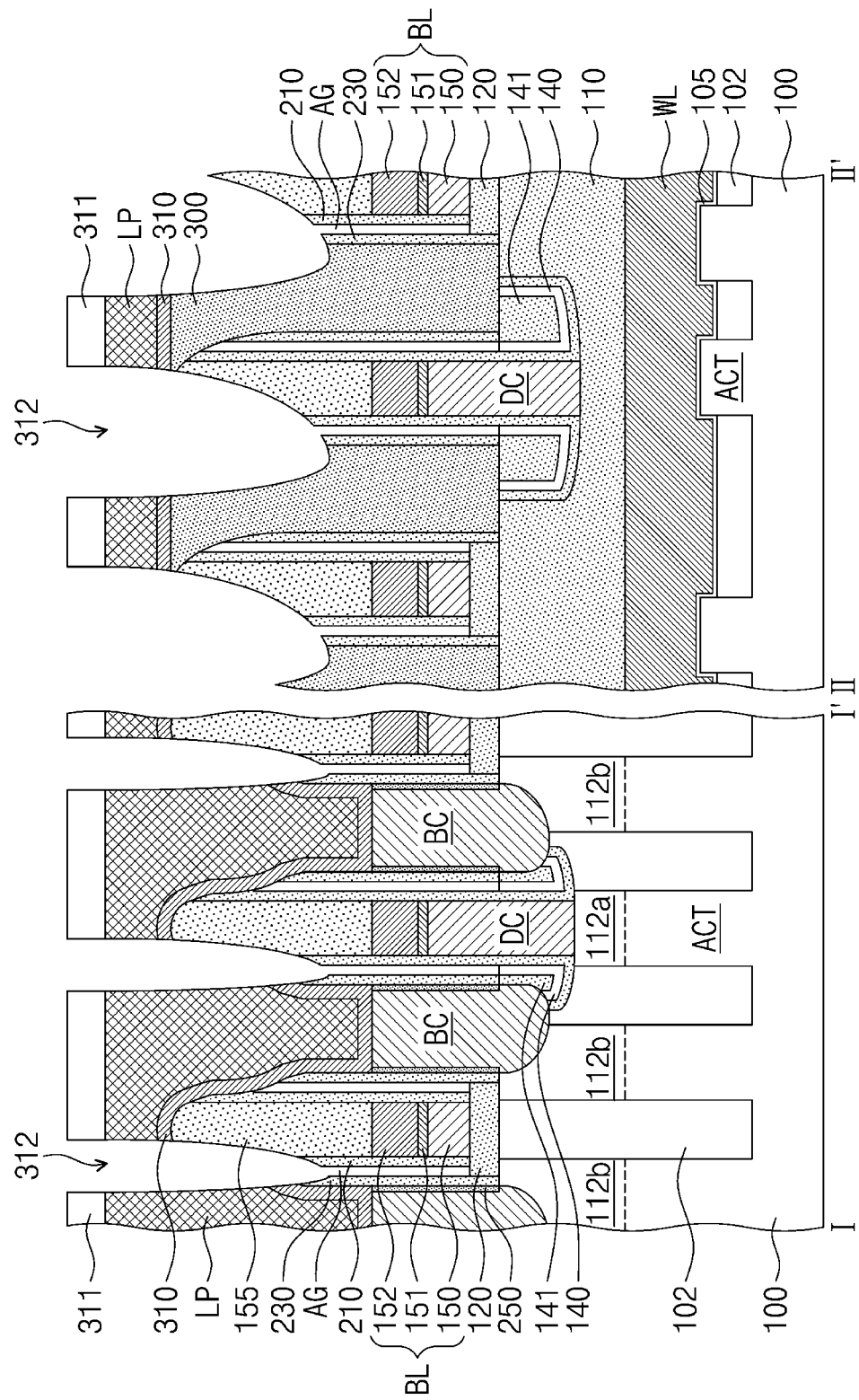

Referring to FIGS. 10A and 10B, a landing pad layer may be formed on the entire surface of the substrate 100, filling spaces between the bit-line capping patterns 155. For example, the landing pad layer may include or may be formed of tungsten. Upper mask patterns 311 may be formed on the landing pad layer. For example, the upper mask patterns 311 may include or may be formed of an amorphous carbon layer (ACL). The upper mask patterns 311 may define positions of landing pads which will be discussed below. The upper mask patterns 311 may be formed to vertically overlap the storage node contacts BC. When viewed in the plan view, the upper mask patterns 311 may be shaped like a plurality of islands that are spaced apart from each other.

An etching process may be performed in which the upper mask patterns 311 are used as an etching mask to partially remove the landing pad layer, the conductive barrier layer 310, and the bit-line capping pattern 155. Therefore, landing pads LP may be formed, and at the same time, second recesses 312 may be formed. In this step, the first and second spacers 210 and 230 on one side of the bit-line capping pattern 155 may be removed to expose a top end of the sacrificial spacer 220. When the etching process is performed to form the landing pads LP and the second recesses 312, etchant supply may be controlled to suppress sidewalls of the landing pads LP from being etched, with the result that the widths of the landing pads LP may be prevented from being reduced. Accordingly, a process margin for the landing pads LP may increase. In an embodiment, the formation of the landing pad layer and the etching process thereof may be performed continuously.

A selective removal may be performed on the sacrificial spacer 220 exposed to the second recesses 312. An etchant that etches the sacrificial spacer 220 may be introduced through the second recesses 312 to remove the sacrificial spacer 220. The etchant may be introduced into the sacrificial spacer 220. The introduction of the etchant may continue satisfactorily without being interrupted by the dielectric fence 300 or the like, and thus the sacrificial spacer 220 may be completely removed. The sacrificial spacer 220 does not remain, but may be fully replaced with an air gap AG. Accordingly, the air gap AG may be evenly provided on a sidewall of the bit line BL, and as a result, the bit line BL may decrease in capacitance dispersion. In an embodiment, the air gap AG may reduce parasitic capacitance between the bit lines BL adjacent to each other.

Referring to FIGS. 1A and 1B, the upper mask patterns 311 may be removed to expose top surfaces of the landing pads LP. The upper mask patterns 311 may be removed before the air gap AG is formed. An upper buried pattern 320 may be formed between the landing pads LP. For example, the upper buried pattern 320 may fill the second recess 312. The upper buried pattern 320 may close an entrance of the air gap AG. For example, the upper buried pattern 320 may cover the top of the air gap AG. The upper buried pattern 320 may include or may be formed of a dielectric material, for example, silicon oxide or silicon nitride. The term "air" as discussed herein, may refer to atmospheric air, or other gases that may be present during the manufacturing process.

Bottom electrodes BE may be formed on the landing pads LP. The bottom electrodes BE may include or may be formed of impurity-doped silicon, metal, or metal compounds. A dielectric layer 330 may be formed on the bottom electrodes BE. The dielectric layer 330 may conformally cover top surfaces of the bottom electrodes BE. The dielectric layer 330 may be a single layer, or a combination thereof, including at least one metal oxide, such as $HfO_2$, $ZrO_2$, $Al_2O_3$, $La_2O_3$, $Ta_2O_3$, and $TiO_2$, and/or perovskite dielectric materials, such as $SrTiO_3$(STO), $(Ba,Sr)TiO_3$ (BST), $BaTiO_3$, PZT, and PLZT. A top electrode TE may be formed on the dielectric layer 330. The top electrode TE may include or may be formed of impurity-doped silicon, metal, or metal compounds. The bottom electrodes BE, the dielectric layer 330, and the top electrode TE may constitute data storage elements (e.g., capacitors).

According to a semiconductor memory device in accordance with some example embodiments of the present inventive concepts, a dielectric pattern may be interposed between a storage node contact and a bit-line spacer, and thus dangling bonds may be prevented from being formed between the storage node contact and the bit-line spacer. Accordingly, at the storage node contact, the occurrence of depletion may be prevented, and eventually the semiconductor memory device according to the present inventive concepts may increase in reliability and electrical characteristics.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor memory device, comprising:
    a substrate that includes a device isolation pattern defining an active pattern extending in a first direction, the active pattern including a first source/drain region and a second source/drain region;
    a word line that extends in a second direction intersecting the first direction;
    a bit line on the word line and electrically connected to the first source/drain region, the bit line extending in a third direction that intersects both the first direction and the second direction;
    a bit-line spacer on a sidewall of the bit line;
    a storage node contact electrically connected to the second source/drain region and spaced apart from the bit line, the bit-line spacer being disposed between the bit line and the storage node contact; and
    a dielectric pattern between the bit-line spacer and the storage node contact,
    wherein the bit-line spacer includes:
    a first spacer that covers the sidewall of the bit line; and
    a second spacer between the dielectric pattern and the first spacer,
    wherein the entirety of the first spacer is spaced apart from the entirety of the second spacer, and
    wherein the dielectric pattern contacts the second spacer.

2. The semiconductor memory device of claim 1,
    wherein an uppermost surface of the dielectric pattern and an uppermost surface of the storage node contact are positioned at the same height, and
    wherein a bottom surface of the dielectric pattern is coplanar with a top surface of the substrate.

3. The semiconductor memory device of claim 1,
    wherein the dielectric pattern includes a material different from a material of the first spacer and a material of the second spacer.

4. The semiconductor memory device of claim 1,
wherein the dielectric pattern includes silicon oxide or hafnium oxide.

5. The semiconductor memory device of claim 1,
wherein, when the semiconductor memory device is viewed in a plan view, the dielectric pattern has a tetragonal ring-shaped structure or a circular ring-shaped structure.

6. The semiconductor memory device of claim 1,
wherein the entirety of the second spacer has a first width in the second direction, and
wherein the entirety of the dielectric pattern has a second width in the second direction which is less than the first width of the second spacer.

7. The semiconductor memory device of claim 1, further comprising:
a landing pad electrically connected to the storage node contact; and
an upper buried pattern on a sidewall of the landing pad,
wherein the bit-line spacer is provided with an air gap between the first spacer and the second spacer, and
wherein the upper buried pattern covers a top of the air gap.

8. The semiconductor memory device of claim 1, further comprising:
a bit-line capping pattern on the bit line; and
a bit-line contact electrically connected to the first source/drain region.

9. The semiconductor memory device of claim 1, further comprising:
a landing pad that has an electrical connection with the storage node contact and vertically overlaps a portion of the bit line;
a bottom electrode on the landing pad; and
a top electrode on the bottom electrode.

10. The semiconductor memory device of claim 1,
wherein the dielectric pattern covers a sidewall of the storage node contact and a sidewall of the second spacer.

11. A semiconductor memory device, comprising:
a substrate that includes a device isolation pattern defining an active pattern extending in a first direction, the active pattern including a first source/drain region and a second source/drain region;
a word line that extends in a second direction intersecting the first direction;
a bit line on the word line and electrically connected to the first source/drain region, the bit line extending in a third direction that intersects both the first direction and the second direction;
a bit-line spacer on a sidewall of the bit line;
a storage node contact electrically connected to the second source/drain region and spaced apart from the bit line, the bit-line spacer being disposed between the bit line and the storage node contact;
a dielectric fence vertically overlapping the word line and between the storage node contact and another storage node contact; and
a dielectric pattern disposed in a space between the storage node contact and the bit-line spacer and disposed in a space between the storage node contact and the dielectric fence,
wherein, when the semiconductor memory device is viewed in a plan view, the dielectric pattern encloses the storage node contact.

12. The semiconductor memory device of claim 11,
wherein the dielectric pattern, when viewed in a plan view, has tetragonal ring-shaped structure or a circular ring-shaped structure, and
wherein the bit-line spacer includes:
a first spacer between the bit line and the storage node contact and adjacent to a sidewall of the bit line;
a second spacer between the bit line and the storage node contact and adjacent to a sidewall of the storage node contact; and
an air gap between the first spacer and the second spacer.

13. The semiconductor memory device of claim 12,
wherein an uppermost surface of the dielectric pattern is lower than an uppermost surface of the second spacer, the uppermost surface of the second spacer is higher that an uppermost surface of the bit line, and an uppermost surface of the first spacer is higher than the uppermost surface of the second spacer.

14. The semiconductor memory device of claim 11,
wherein a bottom surface of the dielectric pattern is coplanar with a top surface of the substrate, and the dielectric pattern covers a sidewall of the storage node contact, a sidewall of the bit-line spacer, and a sidewall of the dielectric fence.

15. The semiconductor memory device of claim 11, further comprising:
a bit-line capping pattern on the bit line; and
a conductive barrier layer that conformally covers the bit-line capping pattern, the storage node contact, and the bit-line spacer.

16. The semiconductor memory device of claim 11,
wherein the bit line includes:
a first bit-line pattern on the substrate;
a second bit-line pattern on the first bit-line pattern; and
a bit-line barrier pattern between the first bit-line pattern and the second bit-line pattern.

17. The semiconductor memory device of claim 11, further comprising:
a landing pad that has an electrical connection with the storage node contact and vertically overlaps a portion of the bit line;
a bottom electrode on the landing pad;
a top electrode on the bottom electrode; and
a dielectric layer between the bottom electrode and the top electrode.

18. A semiconductor memory device, comprising:
a substrate that includes an active pattern having a major axis in a first direction, the active pattern including a first source/drain region and a pair of second source/drain regions that are spaced apart in the first direction from each other, the first source/drain region being disposed between the pair of second source/drain regions, and the substrate including a device isolation pattern that defines the active pattern;
a word line that extends in a second direction intersecting the first direction;
a bit line on the word line and electrically connected to the first source/drain region, the bit line extending in a third direction that intersects both the first direction and the second direction;
a first bit-line spacer on a sidewall of the bit line;
a first storage node contact electrically connected to one of the pair of second source/drain regions and spaced apart from the bit line, the first bit-line spacer being disposed between the first storage node contact and the bit line;

a bit-line contact electrically connected to the first source/drain region;

a bit-line capping pattern on the bit line;

a landing pad electrically connected to the first storage node contact;

a bottom electrode on the landing pad; and a dielectric pattern between the first bit-line spacer and the first storage node contact, wherein the first bit-line spacer includes:

a first spacer that covers the sidewall of the bit line; and a second spacer between the dielectric pattern and the first spacer, wherein the entirety of the first spacer is spaced apart from the entirety of the second spacer, and wherein the dielectric pattern contacts the second spacer.

19. The semiconductor memory device of claim 18, further comprising:

a plurality of storage node contacts including the first storage node contact;

a plurality of bit-line spacers including the first bit-line spacer; and a plurality of dielectric fences on the word line and in spaces between two storage node contacts of the plurality of storage node contacts, wherein the dielectric pattern is further disposed between the first storage node contact and a corresponding one of the plurality of dielectric fences.

20. The semiconductor memory device of claim 18, further comprising:

an air gap between the first spacer and the second spacer; and an upper buried pattern on a top of the air gap and a sidewall of the landing pad.

* * * * *